United States Patent [19]

Ingalsbe et al.

[11] Patent Number: 5,228,072
[45] Date of Patent: Jul. 13, 1993

[54] MULTIWIRE-PAIR TELECOMMUNICATIONS TEST SYSTEM

[75] Inventors: Daryl E. Ingalsbe, Blair, Nebr.; David L. Ingalsbe, Hastings, Minn.; David W. Callahan, Omaha, Nebr.; Jeffrey W. Wilson, New Brighton, Minn.

[73] Assignee: Independent Technologies, Inc., Eagan, Minn.

[21] Appl. No.: 706,632

[22] Filed: May 29, 1991

[51] Int. Cl.⁵ .................. G01R 31/02; H04M 1/24
[52] U.S. Cl. ........................... 379/21; 379/6; 379/5; 379/29; 324/540; 324/542
[58] Field of Search ............... 379/21, 6, 5, 26, 27, 379/29, 30; 324/539, 540, 541, 542

[56] References Cited

U.S. PATENT DOCUMENTS

| | | | |
|---|---|---|---|
| 3,678,379 | 6/1972 | Arvay et al. | 324/73 |
| 3,944,914 | 3/1976 | Simmonds | 324/51 |
| 3,986,106 | 10/1976 | Shuck et al. | 379/21 X |
| 4,074,187 | 2/1978 | Miller et al. | 324/51 |
| 4,277,740 | 7/1981 | Parks | 324/51 |
| 4,375,050 | 2/1983 | Helgerson | 324/51 |
| 4,384,249 | 5/1983 | Medina | 324/51 |

OTHER PUBLICATIONS

Industrial Technology, Inc., Throwmaster Cable Test Set (102A) Brochure Excerpt, 1986.
Industrial Technology, Inc., Faultmaster (III) Brochure Excerpt, Publication Date Unknown.
Teledyne Kinetics, Line Tracker Brochure Excerpt, Publication Date Unknown.

Primary Examiner—Stafford D. Schreyer
Attorney, Agent, or Firm—Joel D. Skinner

[57] ABSTRACT

A dual unit diagnostic system for testing the physical status of a multi-pair cable. Each unit comprises connectors which are connectable to the cable wire pairs, and switches that are connected to the connectors, and are also activatable to provide distinguishable conductive pathways between each wire pair. A signal transmission section is connected to the switches, and provides a signal to a selected wires. A signal reception section is also connected to the switches for receiving a signal from distinguishable wires. A microprocessor is connected to the transmission section and the detection section, and which controls the transmission and reception of signals. A display is connected to the microprocessor and switches, and provides information to distinguish various physical wire status conditions based on the reception of the signal at predetermined wires.

17 Claims, 25 Drawing Sheets

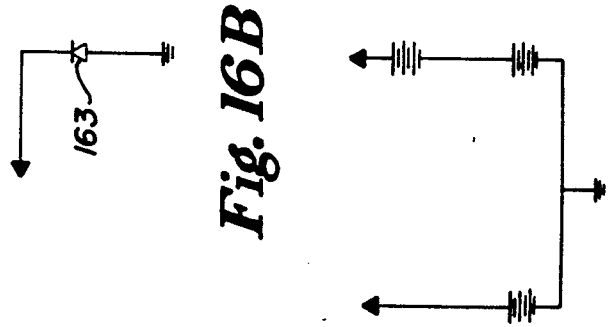
*Fig. 16B*
*Fig. 11*
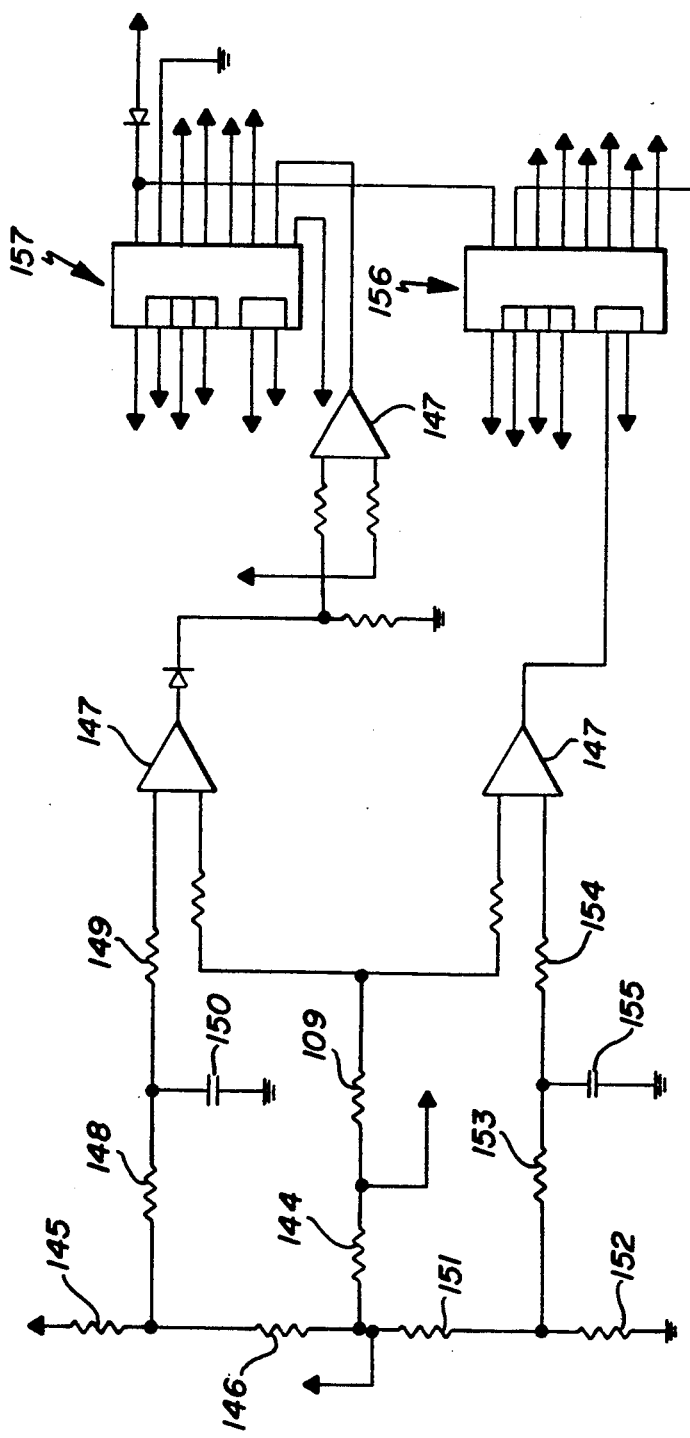
*Fig. 9*

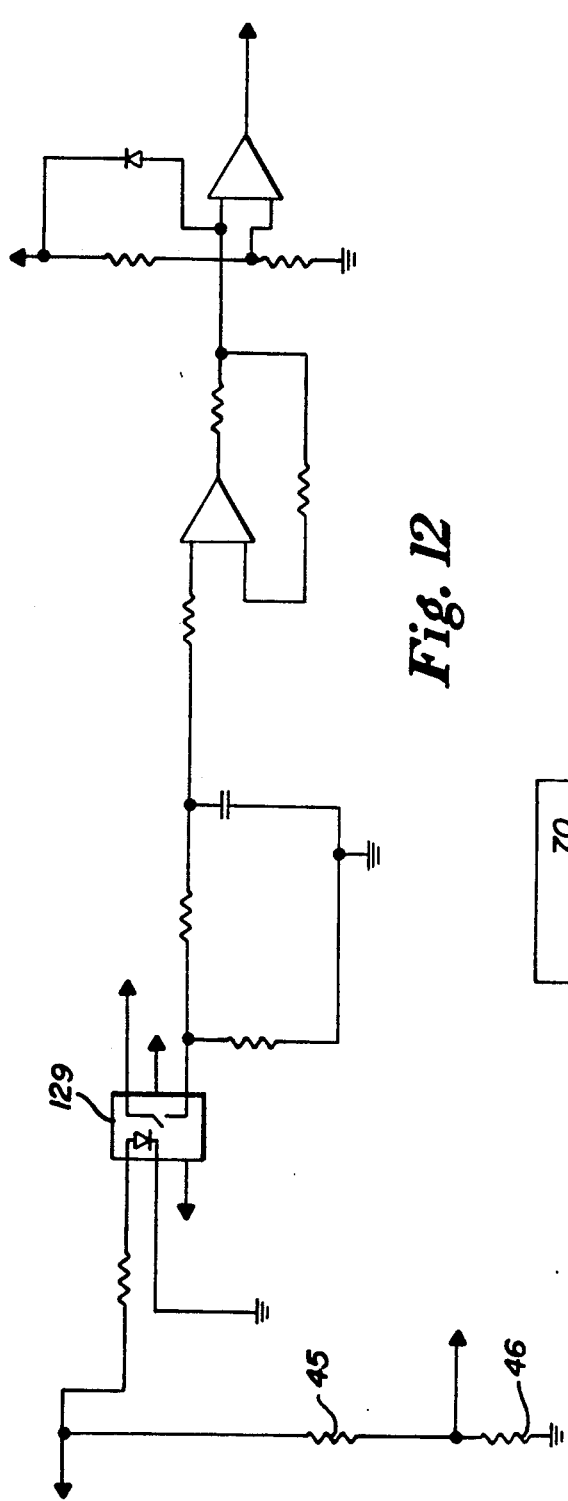
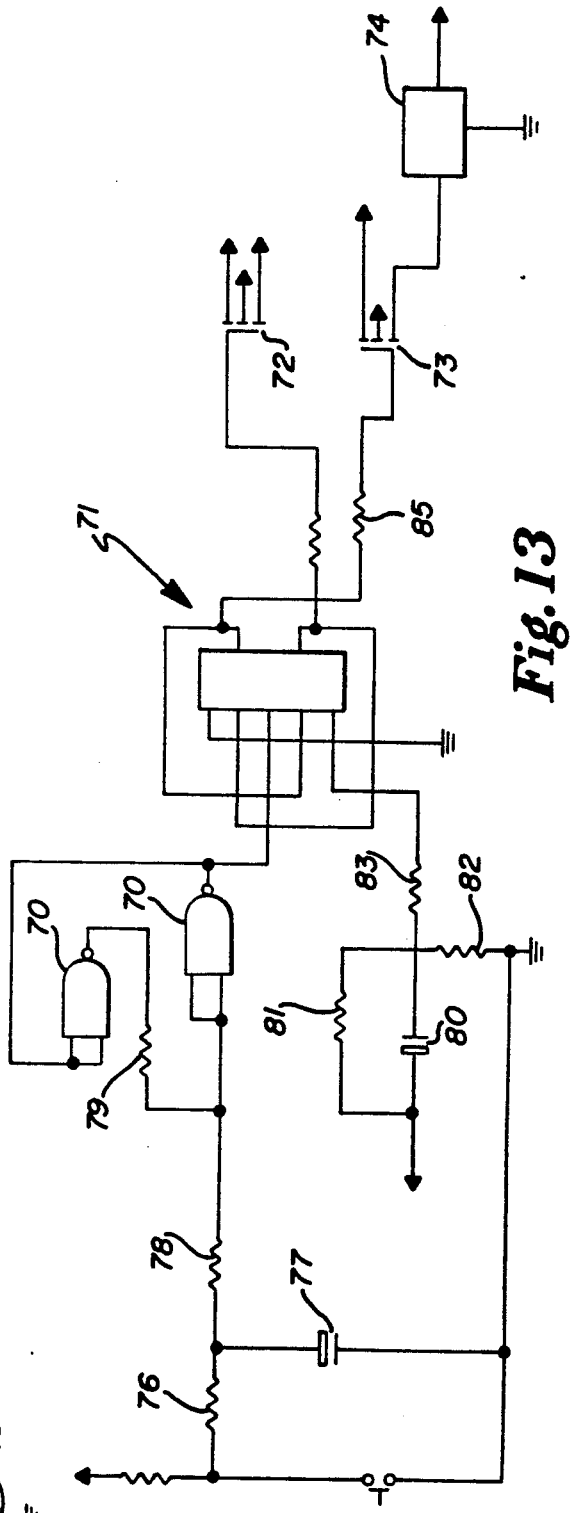
Fig. 12
Fig. 13

| Fig.15A-1 | Fig.15B-1 | Fig.15C-1 |
| --- | --- | --- |
| Fig.15A-2 | Fig.15B-2 | Fig.15C-2 |
| Fig.15A-3 | Fig.15B-3 | Fig.15C-3 |

Fig. 15

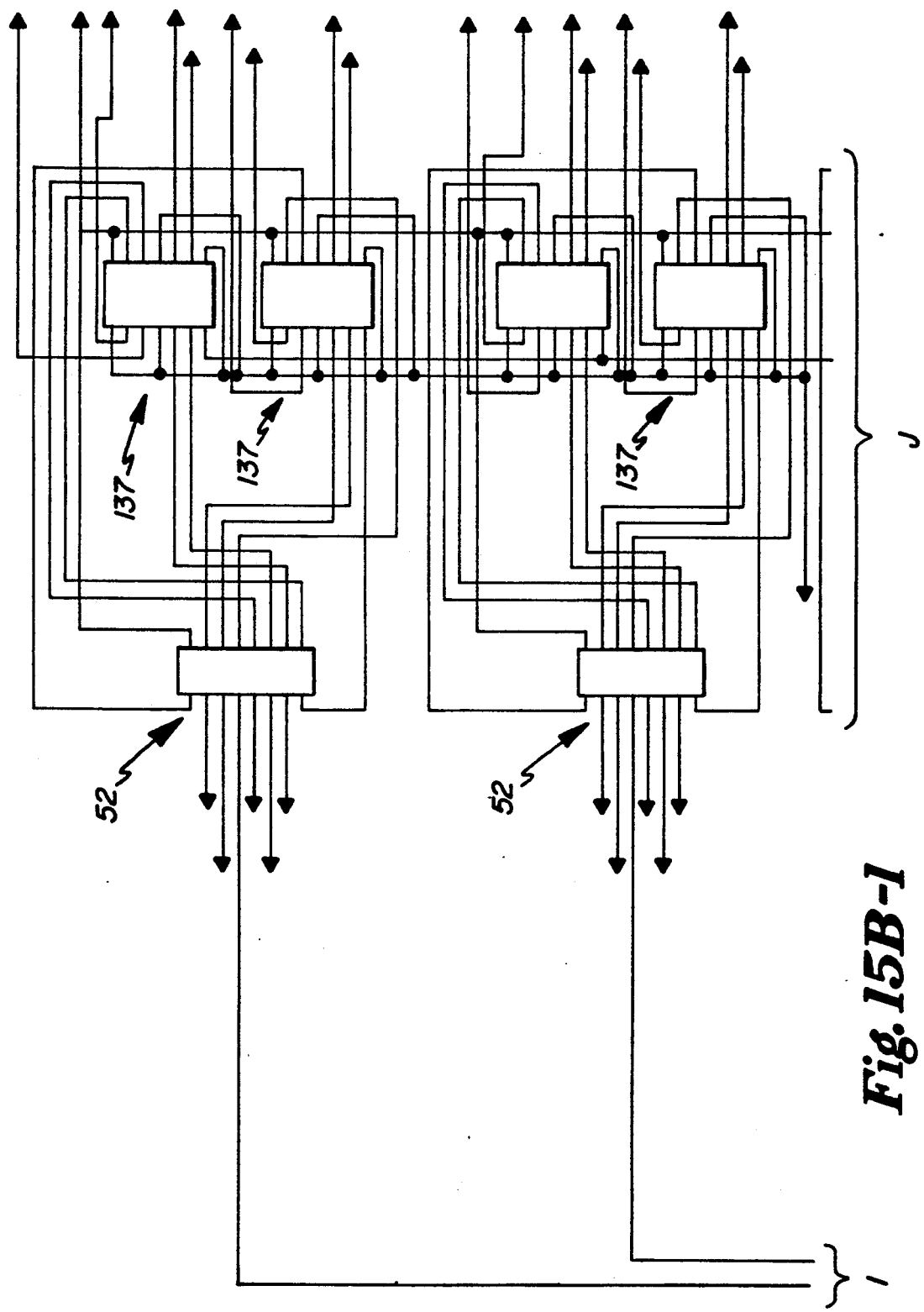

MULTIWIRE-PAIR TELECOMMUNICATIONS TEST SYSTEM

BACKGROUND OF THE INVENTION

This invention relates to electronic test systems and methods and, more particularly, to test devices used in the telecommunications industry. The system of this invention is particularly useful for detecting common fault conditions in telephone cables having multiple pairs of wires.

The expansion of telecommunication networks and their increased use for data transmission has resulted in complex interconnect wiring installations. These complex wiring installations make cable identification and trouble isolation a difficult and time consuming task for repair and installation technicians.

Presently telecommunications wiring installations are typically tested for common faults by utilizing several different test devices, for example, an analog or digital multimeter, and a tone source. However, testing such installations via several devices is very time consuming, requires extensive operator manipulation and further does not lend itself to an established procedure. Such test devices provide only partial, non-automatic testing of potential trouble or fault conditions, or are otherwise limited in use.

Thus, there has arisen a need in the telecommunications industry for a system and method for testing which simplify the proper identification and evaluation of telecommunications interconnect cables. Despite the need for a test system and method which overcome the limitations and problems of the prior art, none insofar as is known have been proposed or developed.

Therefore, it is an object of the present invention to provide a system for automatically testing twenty-five (25) pair telecommunications interconnect cable for common fault conditions, which overcomes the shortcomings, problems and disadvantages of the prior art devices and methods.

A further object of this invention is to provide a compact, portable and hand-operable system which is simple and easy to use for both troubleshooting and installation purposes. Another objective of this invention is to provide a system which is usable, for example, on building cable, outside plant cable and central office cable. An additional object of this invention is to provide a unitary system which replaces multiple devices previously used to perform cable testing tasks.

SUMMARY OF THE INVENTION

The present invention provides a diagnostic system for testing the physical status of a multi-pair cable, for example, telecommunications cable. The system comprises a pair of test units or devices each having connection means which are adapted to be connected to the cable wire pairs, and switch means that are connected to the connection means, and are also activatable to provide distinguishable conductive pathways between each wire pair. Transmission means are connected to the switch means, and provide a signal to a selected wire pair. Detection means are also connected to the switch means, and are for receiving a signal from a distinguishable wire among the cable wire pairs. A microprocessor is connected with the transmission means and the detection means which controls the transmission and reception of the signal to and from predetermined wires. Indicating means are connected to the microprocessor and the switch means, and provide information to distinguish various physical wire status conditions based on the reception of the signal at predetermined wires.

These and other benefits of this invention will become clear from the following description by reference to the drawings.

BRIEF DESCRIPTION OF THE DRAWINGS

FIG. 9 is a schematic circuit diagram of the voltage sensing section of the device;

FIG. 11 is a schematic circuit diagram of the 19 volt supply for the protection section of the device;

FIG. 12 is a schematic circuit diagram of the ground continuity detector of the device;

FIG. 13 is a schematic circuit diagram of the power on/off section of the device;

FIGS. 15A1-A3, 15B1-B3, 15C1-C3 are schematic circuit diagrams of the line test switch banks of the device;

FIG. 16B is a schematic circuit diagram of a tranzorb; and

DESCRIPTION OF THE PREFERRED EMBODIMENT

Figure 1:
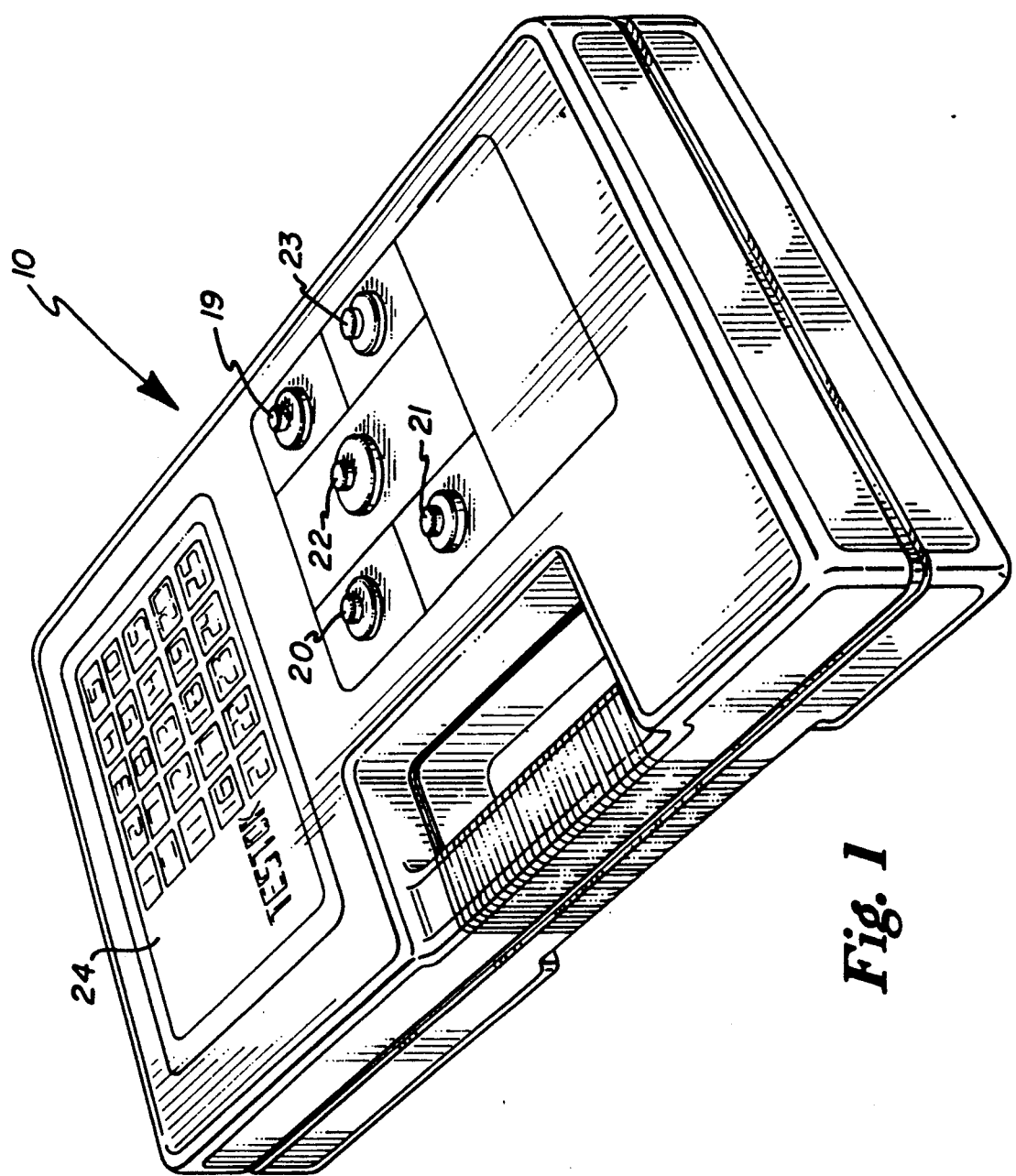
FIG. 1 is a perspective view of the test device of the present invention.

The present invention is a testing system which automatically makes a series of tests on multi-wire pair telecommunications cable. The system generally comprises two identical, portable and hand-operable test units 10, shown in FIG. 1, which are connectible to remote locations on a cable being tested. The two test units automatically establish a communications link over a predetermined wire pair (phone line) in the cable being tested to cooperate with one another. The tests may be controlled from either end, such that whenever a unit is activated, that unit is automatically designated as the "Master", and the unit at the other end as the "Remote" (or slave). A single test unit may also be used to perform certain tests.

The system displays trouble conditions, as seen from the master end. The trouble indication may be verified by reversing the Master-Remote relationship and retesting from the opposite cable end. This is preferred because one trouble condition may appear to be a different trouble condition when viewed from the opposite end. For example, a wire pair may be smashed in a terminal lid and appear to be "open" from one end, and "shorted" from the other end. For technician convenience, both units display the same indications.

With a single unit 10, each wire pair of a cable can be automatically tested for power faults, ground faults and shorts. With a second unit connected to the remote end of the cable, additional faults can be identified, including opens, crosses, and reversals, and lack of ground continuity. Each unit 10 automatically determines whether or not a second unit is connected to the other end of the cable, determines whether to perform single-ended tests or double-ended tests, and then performs the applicable sequence of tests. Tests are performed in the following order: (1) power fault; (2) ground continuity (if 2-end); (3) ground fault test; and (4) short test. If the system is in a single-end test mode, the testing sequence stops at this point and any faults are displayed. If it is a 2-ended test mode, the system will continue with a wire open test, followed by a wire reversal test, then a wire cross test.

Subsequent to the test sequence, each unit 10 displays all faults present on the screen simultaneously. The operator can also review each fault individually, wherein the test will stop as soon as the first fault is found. The test may then be continued until the next fault is found. When the test procedure is completed, the system loops around to the start of the sequence and goes through the complete test procedure again. The system will keep looping until all faults are cleared.

Each unit 10 can also generate a tone for wire identification purposes. Tone can be placed on any pair, and can also be moved to other pairs. In addition to testing 25 wire pair cable, the system can be operated in 4, 3, 2 and 1-pair modes for use with a large range of telecommunications and other types of cables or conductors.

HARDWARE OVERVIEW

Figure 4:
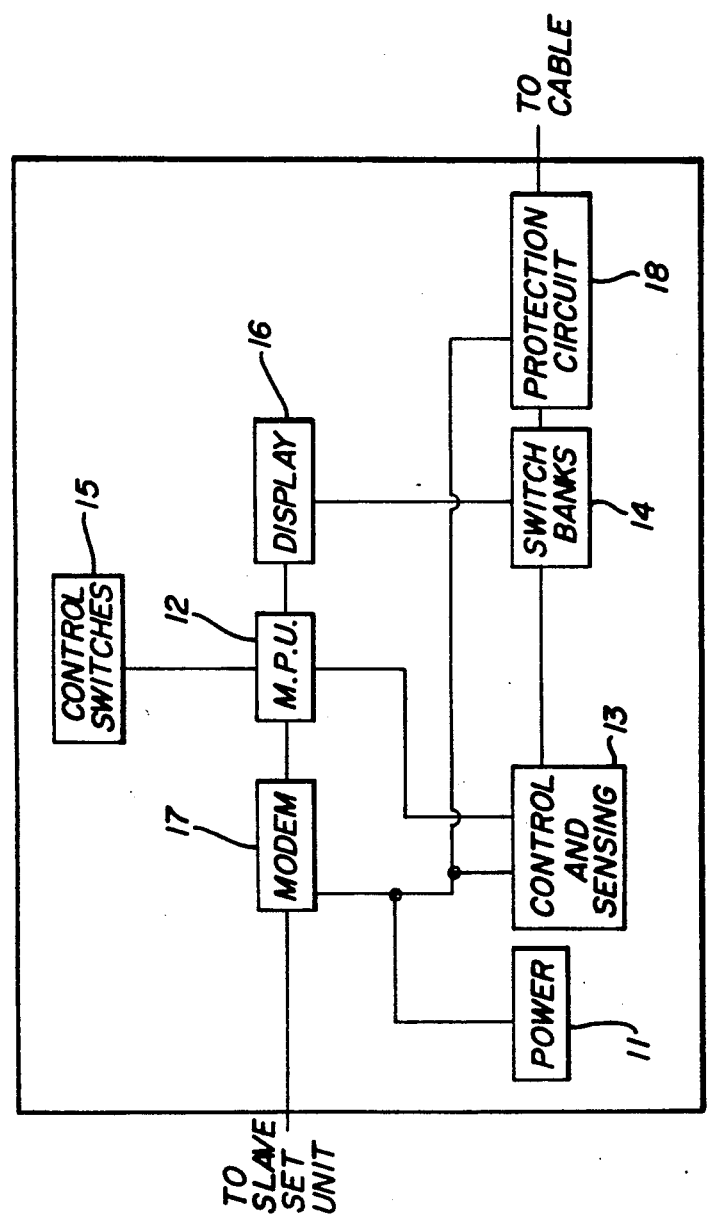
FIG. 4 is a generalized schematic diagram of the device circuitry.
Figure 5:
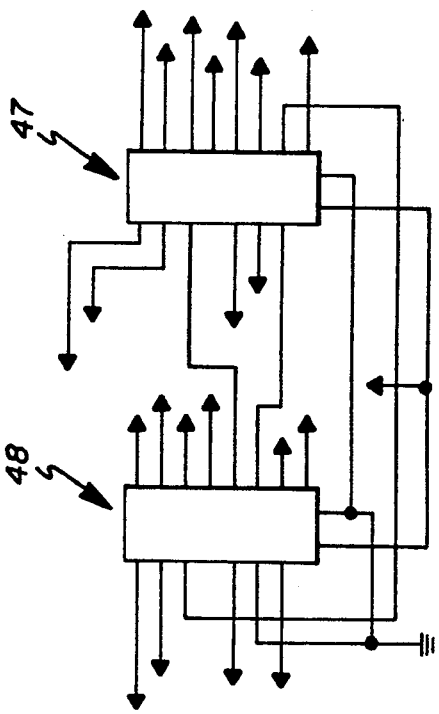
FIG. 5 is a schematic circuit diagram of the address decoder section of the device.
Figure 14:
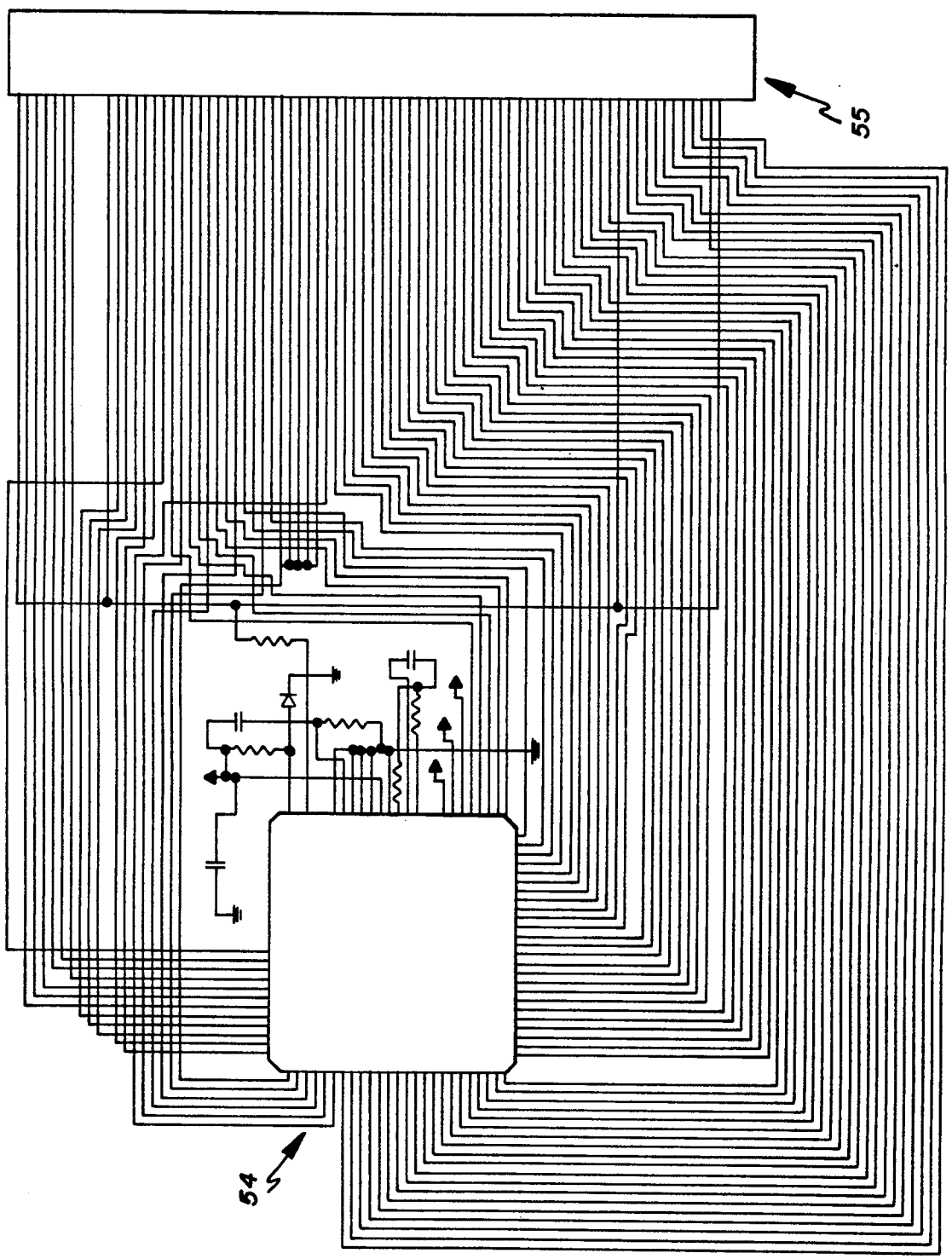
FIG. 14 is a schematic circuit diagram of the display section of the device.
Figures 1, 15A:
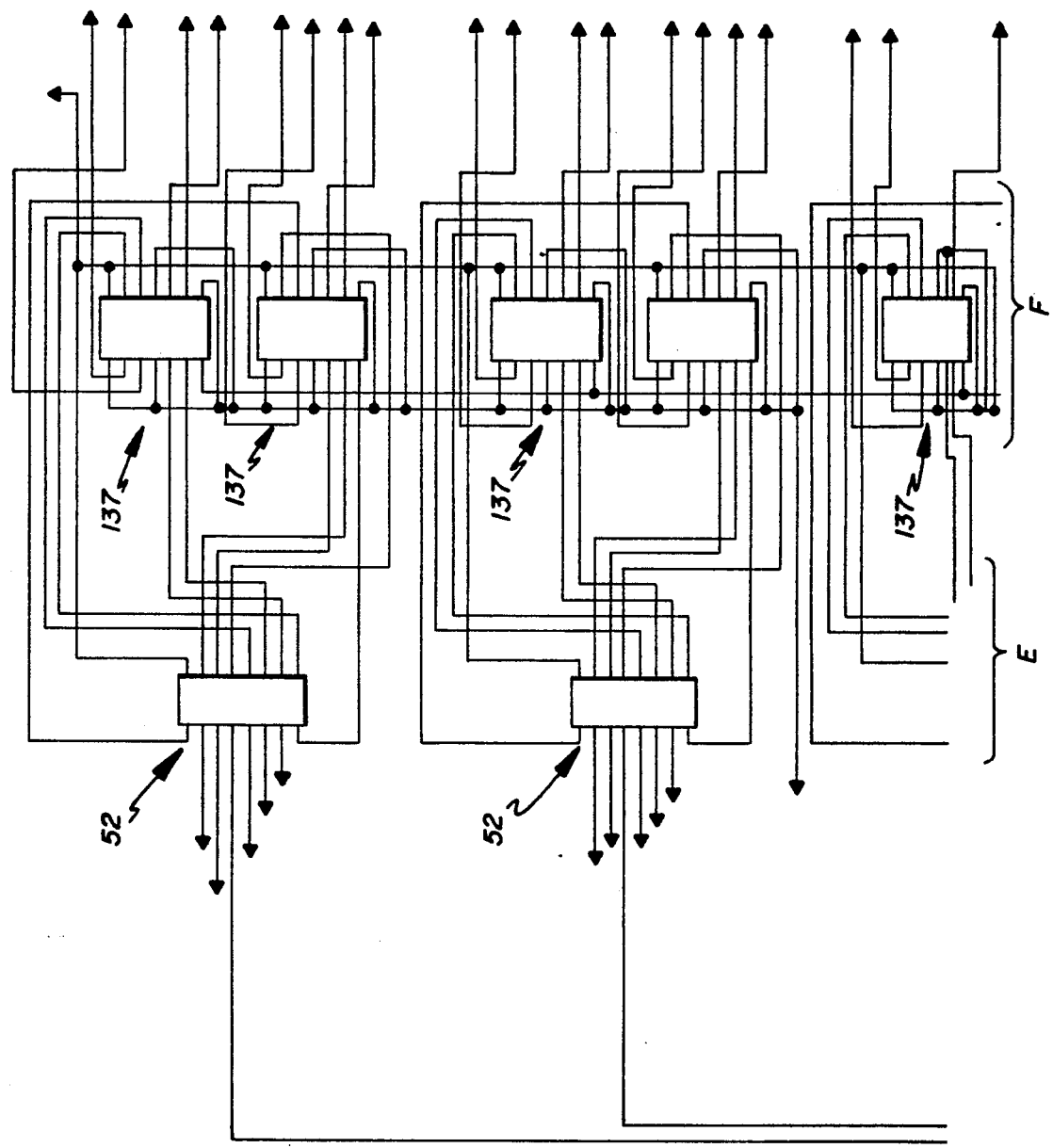
Figures 2, 15A:
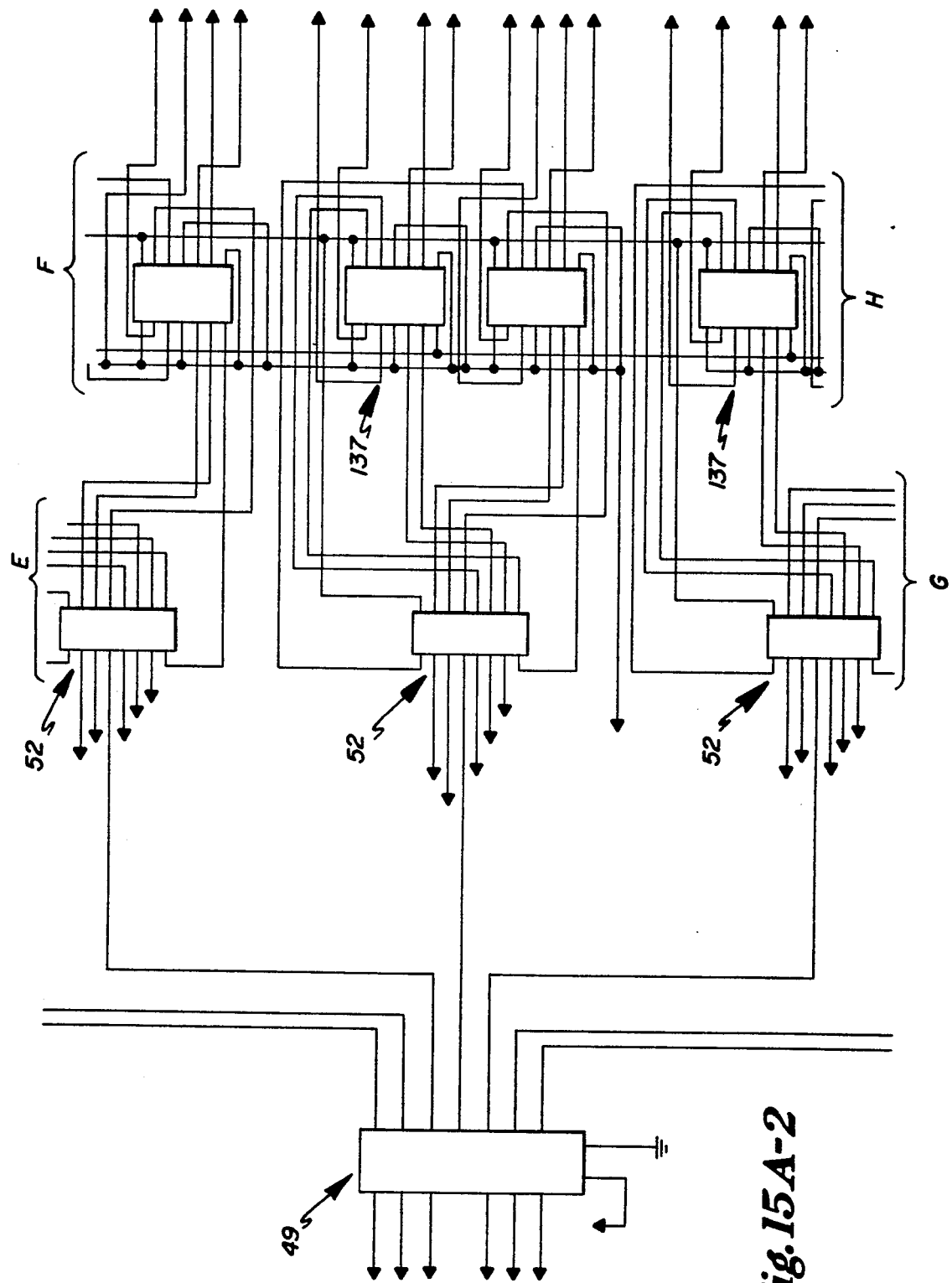
Figures 3, 15A:
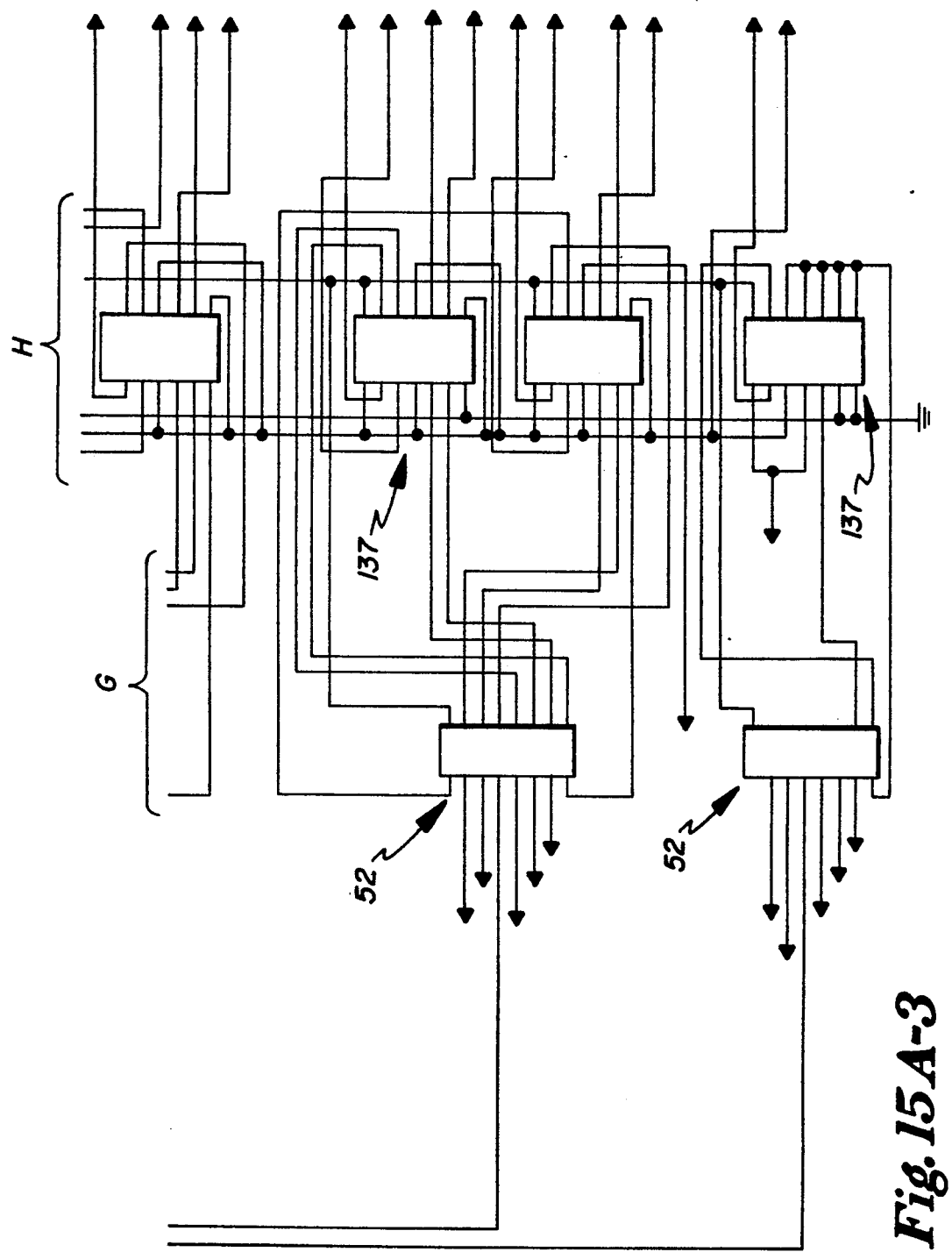
Figures 2, 15B:
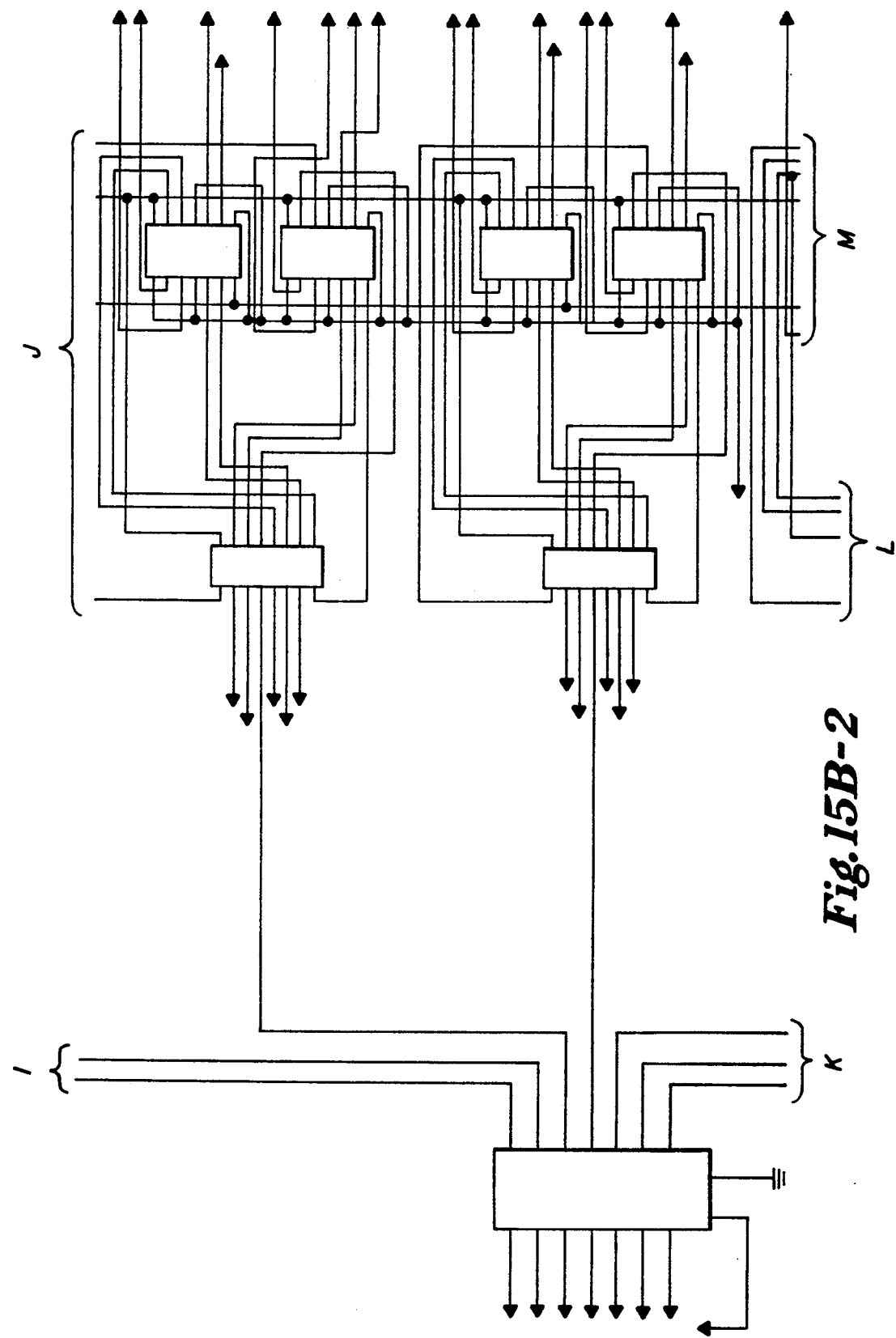
Figures 3, 15B:
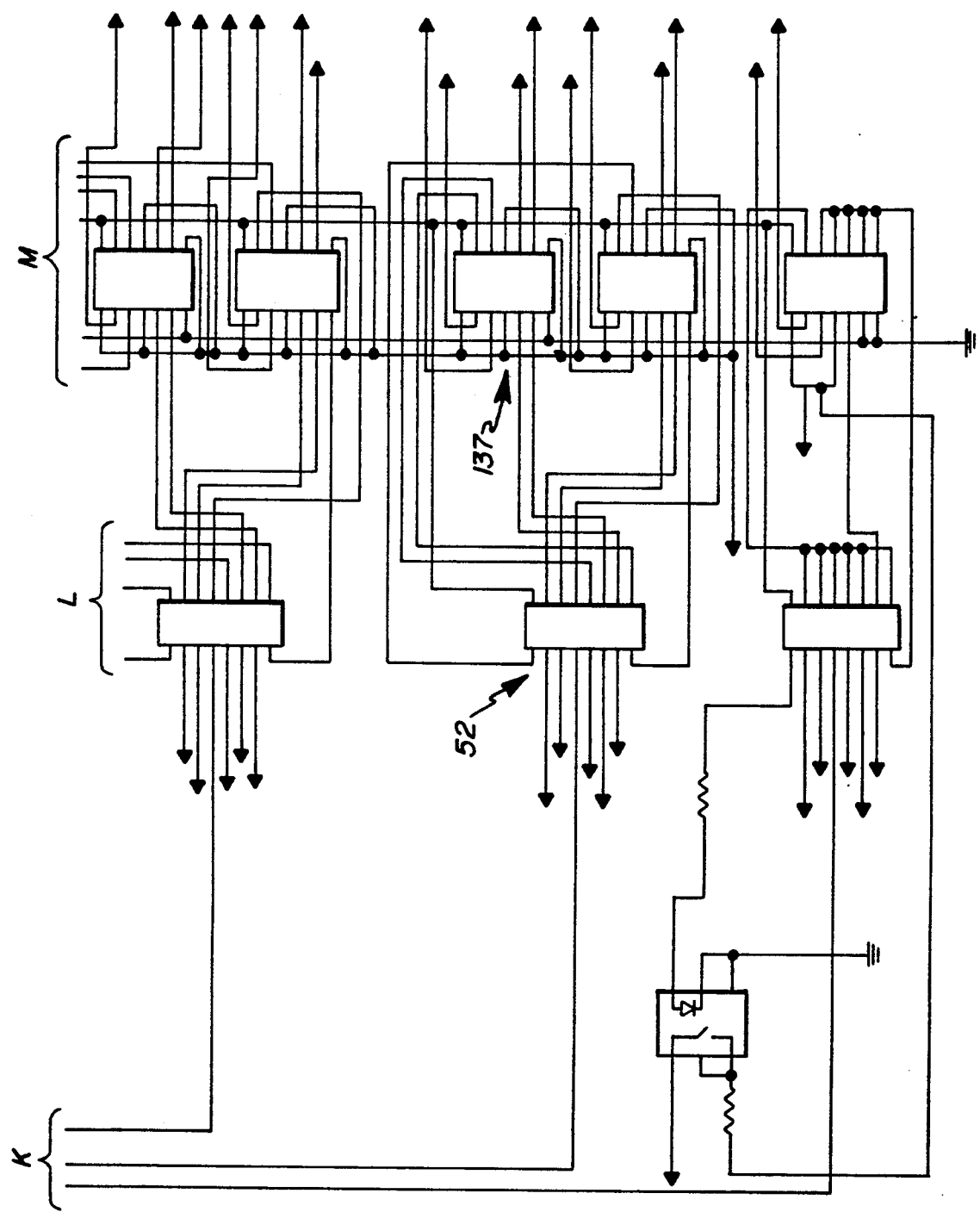

Referring to FIG. 4, the basic structure of each unit 10 comprises power sections 11 (see FIGS. 6, 11, and 13), microprocessor sections 12 (see FIGS. 5 and 7), control and sensings sections 13 (see FIGS. 8, 9, and 12), and switch banks 14 (see FIGS. 15A-B). Control switches 15 and a display section 16 (see FIG. 14) are connected to the microprocessor 12. A modem section 17 (see FIG. 7) is also connected to the microprocessor 12 and provides communication between the microprocessors 12 of the main and remote units 10 during 2-ended testing. The microcontroller 12 controls the placement of drive signals on any one or combination of conductors in the 25-pair (50 conductor) cable via switches, which are preferably constructed in two banks. A third bank of switches (see FIG. 15C) is also preferably utilized to monitor each conductor for the presence of high voltage. Information is primarily acquired by driving a signal out on a line via a 10-volt source (designated Vcc), and then monitoring that line, as well as other lines for a return signal.

A power-fault protection circuit 18 (see FIGS. 16A-B) is preferably placed in-line with each of the 50 conductors at the point of entry into the first and second switch banks to protect the unit circuitry from high voltages that may occasionally be encountered on the conductors during testing.

Referring to FIG. 1, each test unit 10 has five control buttons 19-23 on its front face, which are designated POWER, TEST, TONE, ADVANCE and MODE. The POWER switch 19 activates and deactivates the unit. The MODE or PAIR switch 23 is utilized to select the appropriate number of individual wire pairs present in the cable. The TONE switch 21 activates and deactivates the tone function. The TEST switch 20 initiates an automatic test sequence. And, the ADVANCE switch 22 is utilized to select and isolate a particular wire pair for testing or tone signaling, and to retest in the case of cables with multiple faults as described below. The test unit 10 also has several interface jacks (not shown) for connection to cable terminated with various connectors as known in the art.

Figure 2:
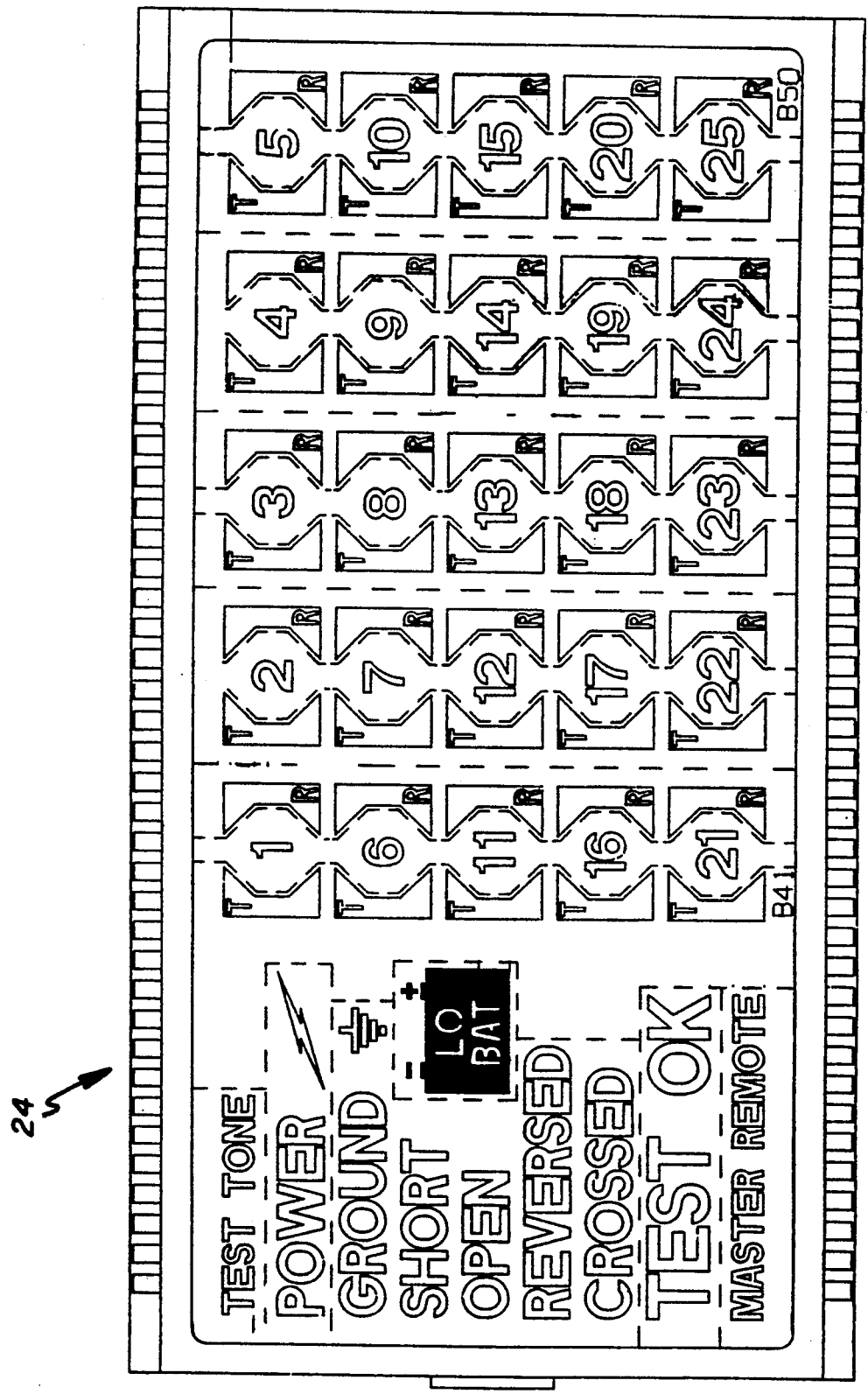
FIG. 2 is a top plan view of the display of the device.
Figures 3, 17:
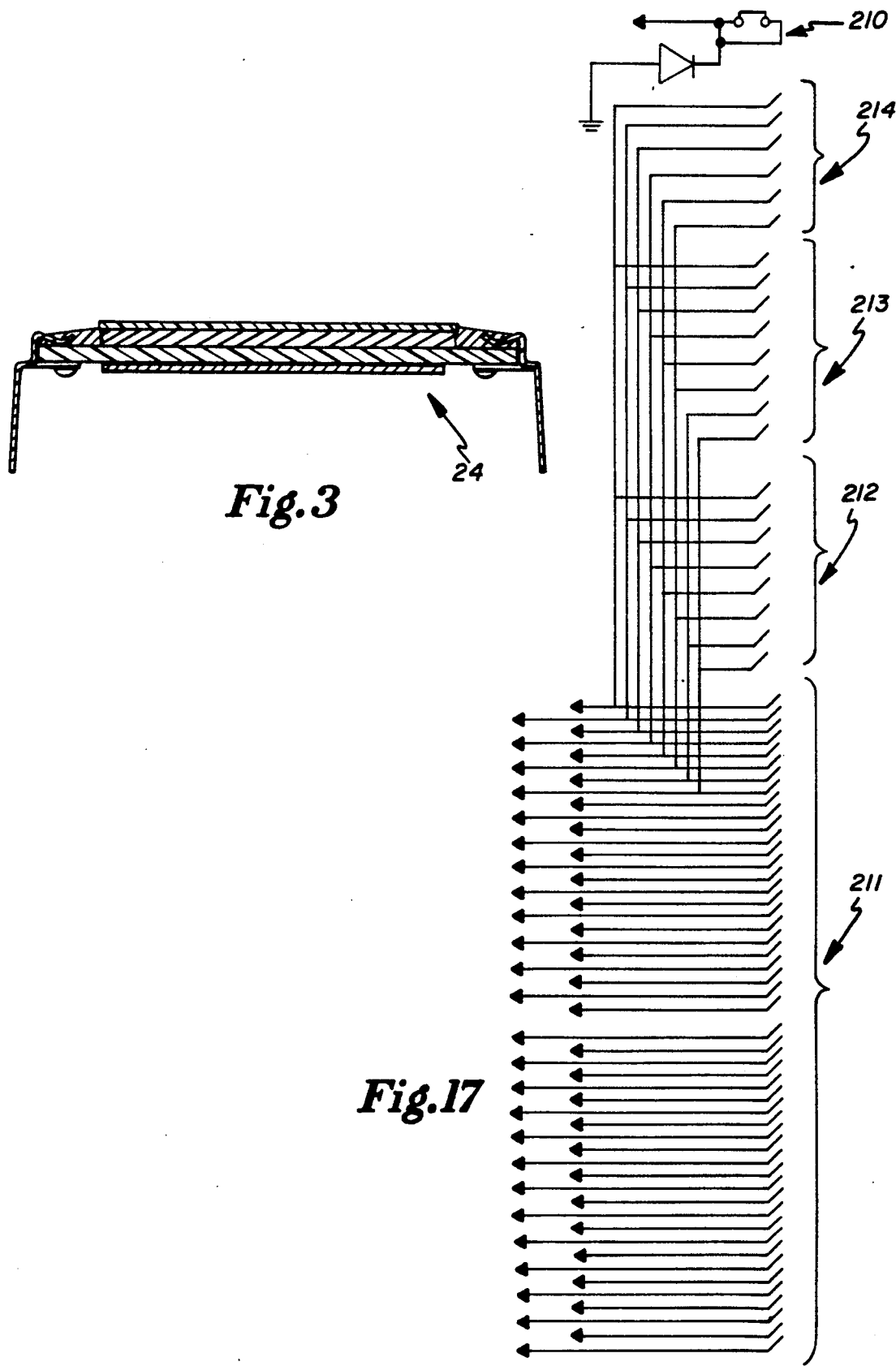
FIG. 3 is a side plan view of the display shown in FIG. 2.
FIG. 17 is a schematic circuit diagram of the device input/output connectors.

Test information is displayed on a multi-color LCD display approximately 2.5×4.5 inches in dimension, which operates on a 5-volt supply. As shown in FIGS. 2 and 3, the display 24 has a plurality of indicators which are described below. Each wire pair has a designation number 1-25, and each separate wire or conductor of the pair is delineated by green (tip or transmit) and red (ring or receive) lugs to the left and right, respectively, of each designation number.

DETAILED HARDWARE DESCRIPTION

Figure 7A:
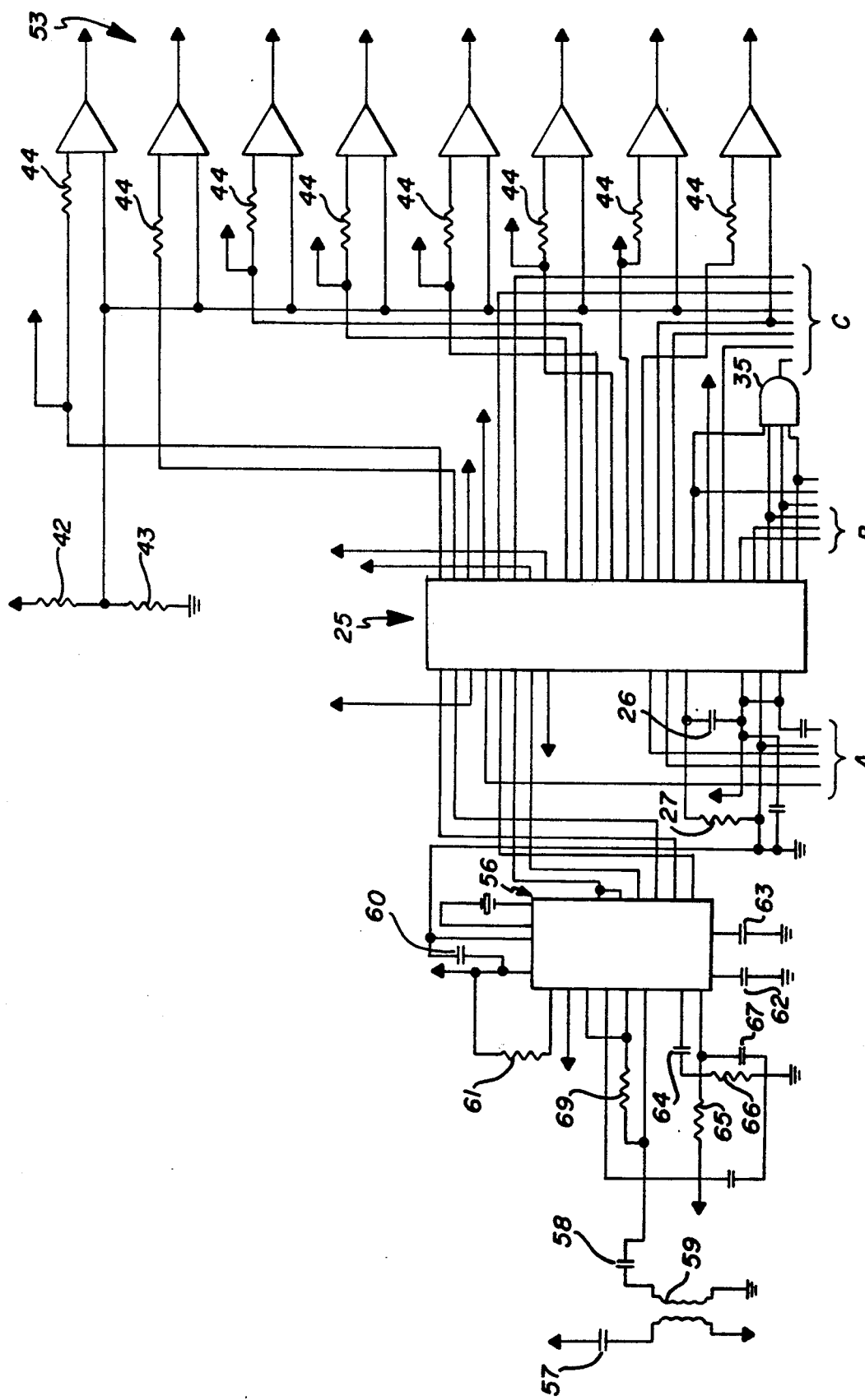
FIG. 7A & 7B are a schematic circuit diagram of the microprocessor and modem sections of the device.
Figure 7B:
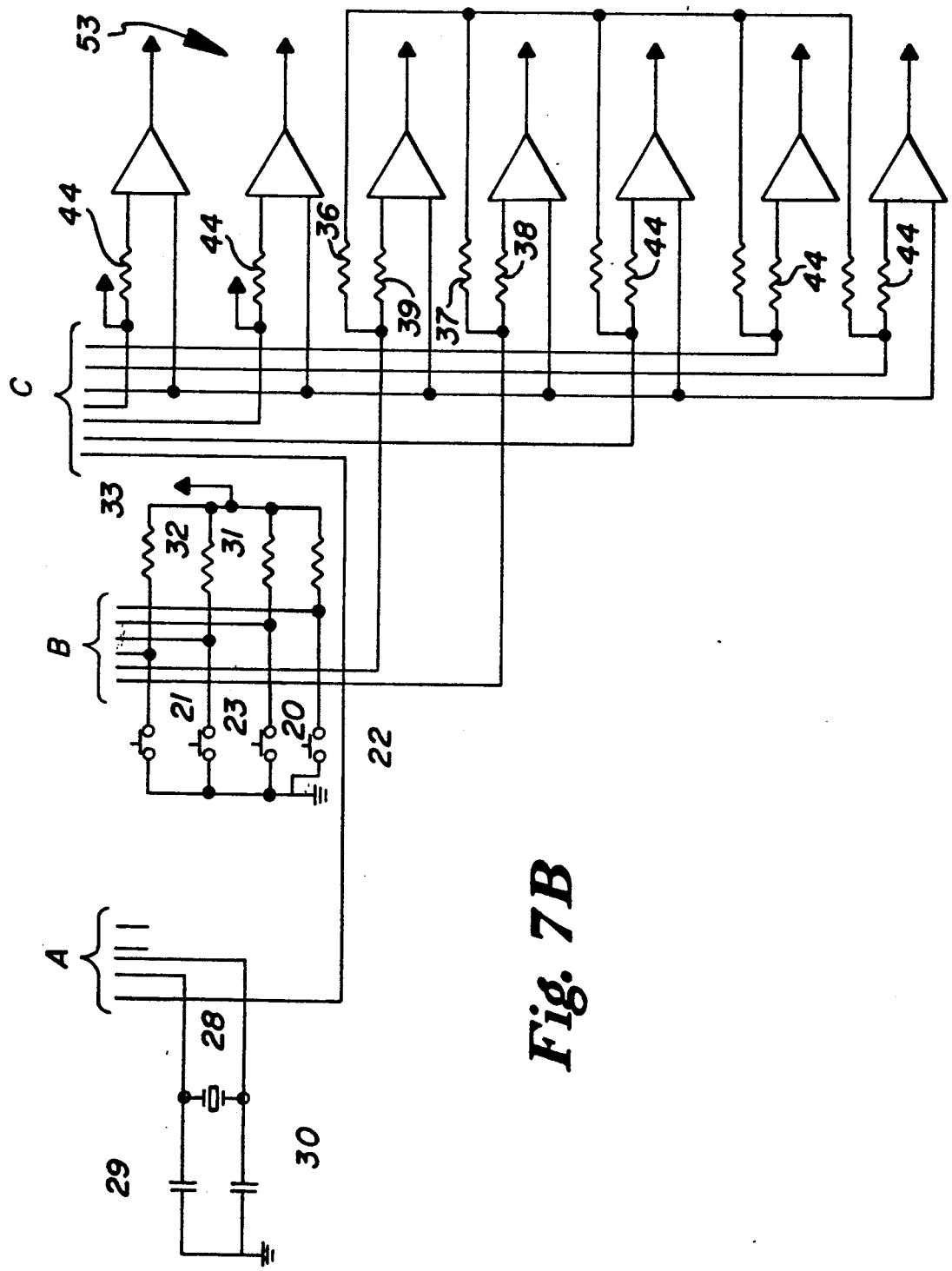

FIG. 7 shows modem and microprocessor circuit sections 17 and 12 which are divided into two main sides, one using 5 volt supply and 5 volt logic levels, and the other using 10 volt supply and 10 volt logic levels. The 10 volt levels cooperate with the CMOS switches and related circuitry utilized to provide controlled connections to the cable wire pairs. The use of relatively inexpensive CMOS circuit elements, provides added economy of manufacture, while the 10 volt system permits testing of increased length cable loops.

The microcontroller 25 is preferably an 87C52 manufactured, for example, by National or Signetics, which has approxiately 8 bytes of program ROM and 256 kbytes of user RAM. Capacitor 26 and resistor R21 provide a reset function, wherein capacitor 26 holds the reset line RST hi for a predetermined time period after unit power-up, and then resistor 27 slowly discharges it down to 0 v. Crystal 28, along with capacitor 29 and capacitor 30, provide an oscillator for the microcontroller clock. Crystal 28 operates at 1 MHz to give the microcontroller 25 a typical current draw of 1 mA. The microcontroller 25 has four 8-bit ports. Ports 0, 1 and 2 provide general I/O pins. Port 3 has pins which are used for special functions. Port 0 requires external pull-up resistors and ports 1, 2 and 3 have internal pull-ups.

The control switches or buttons 20-23 located on the face of the unit 10 are communicatively connected to the microcontroller 25. Port pin P0.0 is connected to the TEST button or switch 20 and to pull-up resistor 31. Port pin P0.1 is connected to the PAIR button 23 and to pull-up resistor 32. Port pin P0.2 is connected to the TONE button 21 and to pull-up resistor 33. Port pin P0.7 is connected to the ADVANCE button 22 and pull-up resistor R34. The pull-up resistors 31, 32, 33, and 34 hold the port lines 0.0, 1, 2 and 7 at a high level until one of the respective buttons 20-23 is activated, whereupon that port line is pulled to ground. The four control buttons or switches 20-23 are also connected to the inputs of a dual 4-input AND-gate 35. When any one of the control buttons 20-23 is pushed, the output of the AND-gate 35 goes low and drives port pin P3.3 low. Port pin P3.3 is an interrupt input (INT1), which goes low to signal the microcontroller 25 when a button has been activated. The microcontroller 25 interrupts a current task and interrogates the four button pins on Port 0 to determine which one of the lines is low, and thereby, which button has been activated.

Port pins P0.4 and P0.3 are used to generate LO tones (LT) and HI tones (HT), respectively. When the unit 10 is put into TONE mode, an interrupt driven software routine alternatingly toggles the HI tone line, and then the LO tone line. Resistors 36 and 37 act as the pull-up resistors on these port pins. The port pins are fed through resistors 38 and 39, respectively, to sections of op-amp 40, which converts their logic levels from 5 v to 10 v.

All four sections of op-amps 53, 68, and 40, and three sections of op-amp 41 are used for level translation between the 5 v logic levels from the microcontroller 25 to 10 v logic levels used by most of the rest of the circuitry. The utilization of the 10 volt system permits testing of relatively longer cable lengths. Resistors 42 and 43 form a resistor divider network to give a reference of 2.5 volts, which is connected to the inverting (−) inputs of the op-amps. The 5 v logic signals are connected to the non-inverting (+) inputs of the op-amps, through current-limiting resistors 44. These resistors 44 limit the current to the non-inverting inputs of the op-amps to protect them during power-up, power-down, and transitions.

Port pin P0.6 is utilized as an input pin to sense whether the ground pin is turned "on" or "off". It is connected, through a resistor divider network formed by resistors 45 and 46, shown in FIG. 12, which converts the 10 v logic level to 5 v.

Port P1 is used to output an 8-bit address. These address lines are used by the microcontroller 25 to select the particular switches of the switch banks see (FIGS. 15 A, B and C) for transmitting and sensing functions. The address lines are also used to control the test voltage connection and current sense circuits. These 8 address lines are level-shifted by op-amps 53, 68 and 40 to a 10 v logic level. The upper three bits of address (A7, A6, A5) are decoded by decoder 47 and one half of decoder 48, shown in FIG. 5. The next two bits of address (A4 and A3) are decoded by one half of decoder 48.

Figures 1, 15C:
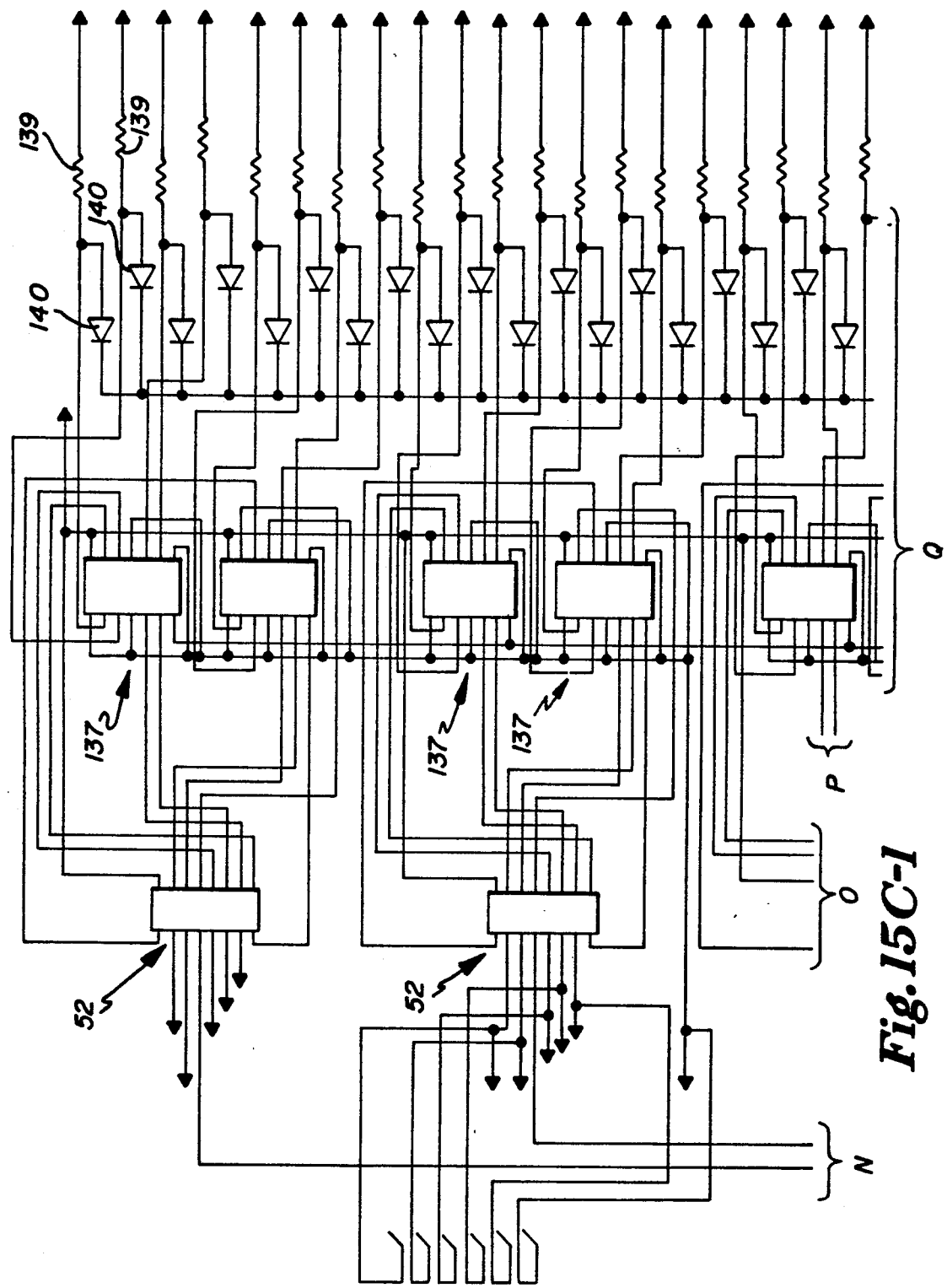
FIG. 15C is a schematic circuit diagram of the power fault test switch bank of the device.
Figures 2, 15C:
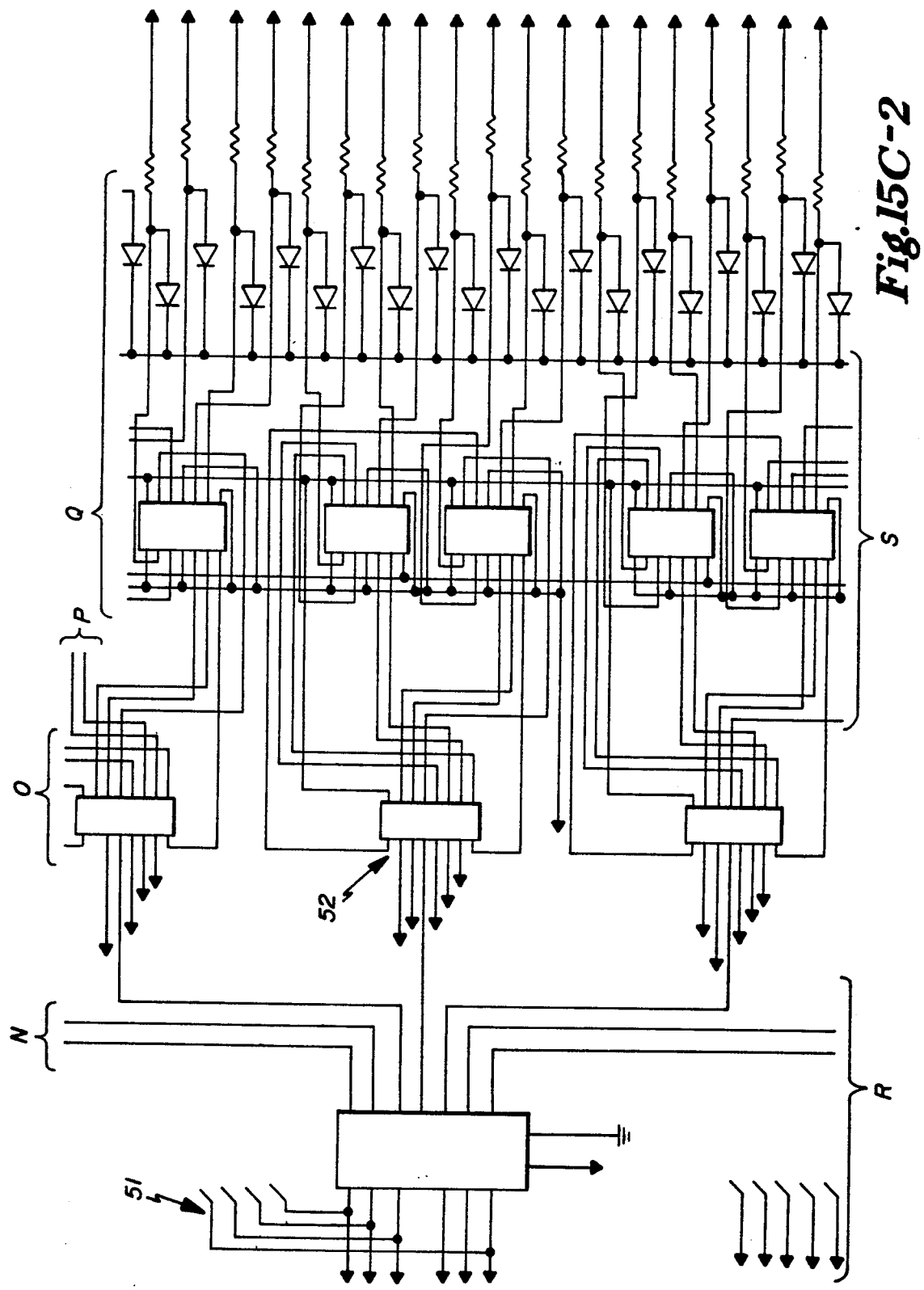
Figures 3, 15C:
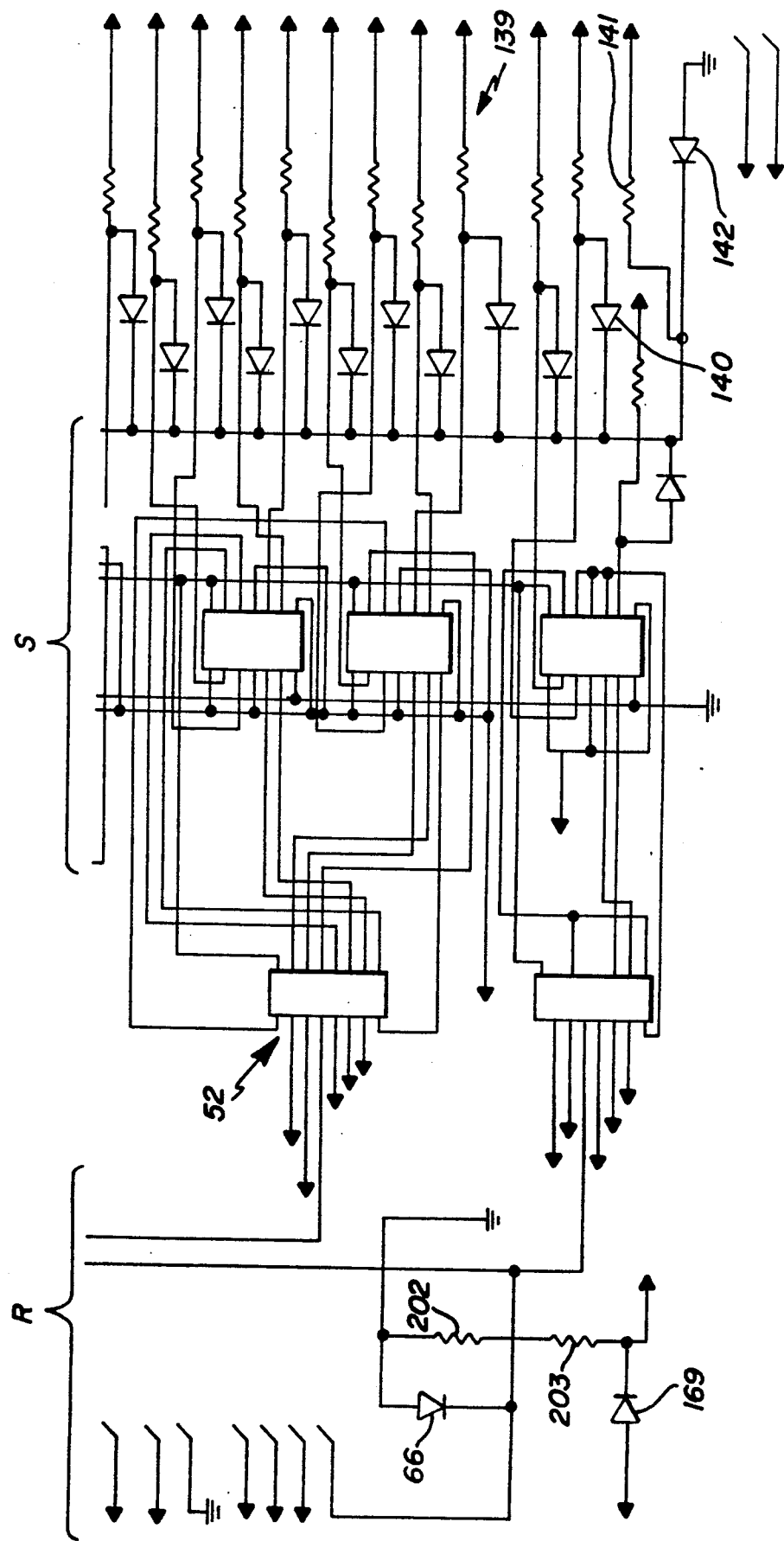

Referring to FIGS. 5 and 15A-C, dual binary ¼ decoders 48 and 47 provide address decoding for the switch banks. On decoder 48, pins 11 and 12 decode the top bit (A7) of address, along with an address enable line (EN1), while the other half of the decoder 48 chip is used for a different operation. Decoder 48 pins 11 and 12 feed into the second decoder 47, which decodes 2 more bits of address (A6 and A5) and the decoding output by decoder 47 feeds into switch bank dual binary ¼ decoder circuits 49, 50 and 51. The first bank of switches shown in FIG. 15A are addressed at 00 through 3F hex. The second bank of switches shown in FIG. 15B are addressed at 40 through 7f hex. And, the third bank of switches shown in FIG. 15C are addressed at 80 through BF hex. The enable line designated EN1 on the microcontroller 25 is operative for all three banks of switches. The microcontroller 25 outputs the address and then toggles enable line (EN1) low and high. Data must be on the lines when the enable line goes low and high. This clocks the data to the switch bank latches 52, which select the particular switches to be turned "on" or "off".

As also shown in FIG. 7, Port pin P2.7 is used for one bit of data output (D), and is level shifted by op-amp 53. Port pin P2.6 is used as an enable output (EN1), and is level shifted by op-amp 53. Port pin P2.4 is used as an input for one bit of data. In a typical write operation, a data bit is put out on port pin P2.7. The address is then put out on port P1. Time is allowed for the data and address to settle. Then the enable line on port pin P2.6 is pulled low momentarily, then pulled high again. This writes the data bit out to the correct data latch. In a typical read operation, the address is put out on port P1 and given time to settle. Then the enable line on P2.6 is pulled low and given time to settle. Then the data input is read from port pin P2.4. Lastly, the enable line on port pin P2.6 is brought high again.

Port pins P2.0, P2.1 and P2.5 are the control lines that load data into a display controller 54 (via lines SRL 1-3), as shown in FIG. 14. Pin P2.0 is a data line, pin P2.1 is a serial bit clock, and pin P2.5 is a load enable line. A typical write operation to the LCD controller 54 80-bit shift register proceeds as follows. A data bit is output on pin P2.0; then the serial bit clock pin P2.1 is toggled, shifting the bit into the LCD controller 54. When 80 bits have been shifted in, load enable line P2.5 us toggled, which loads the 80 new bits into the display register 55, and thus, controls the annunciators on the display 24.

Another Enable line EN2L (low voltage level) and data line DR (see also FIG. 9) are also used for the 5 volt logic level. Port Pins 2.2 and 2.3 provide control lines PRON and PROF that activate and deactivate the power fault protection controller circuit shown in FIG. 10, and described further below. These microcontroller lines are also voltage level shifted.

As also shown in FIG. 7, the modem integrated circuit 56 is a full-duplex, 300 baud modem. It sends and receives modulated signals over wire pair No. 1 of the cable, to and from the remote unit. The modem 56 is connected to wire pair No. 1 through transformer 59 to provide DC isolation from the wire pair. Capacitor 57 provides DC blocking between the tip and ring conductors of pair No. 1, to prevent interfering with DC testing of these two conductors.

The modem 56 is connected to the UART of the microcontroller 25. Pin P3.1 provides a digital serial output from the UART, and is connected into the TXD input of the modem 56. Serial data RXD received from the modem 56 is connected into the microcontroller UART input through pin P3.0. The carrier detect line CD from the modem 56 is sensed via pin P3.4. Pin P3.6 of the microcontroller 25 can select between the originate and answer modes (O/A) of the modem 56. The microcontroller 25 transmits signals via pin P3.5 to turn off the modem 56 entirely, for example, to save battery power.

Modem 56 tones go out on to the phone line through capacitor 58 and transformer 59. A hybrid circuit which operates receive and transmit operations is contained within the modem chip 56. Transmit data is sent out through the serial output port of the microcontroller 25 to TDX of the modem 56 (Transmitted Data Input). Receive data comes back from the modem pin 5 to the serial input port (RXD), pin 10, of the microcontroller 25. Capacitor 60 is a power-supply bypass capacitor. Resistor 61 sets the modem 56 transmit level to −9 dBm. Capacitor 62 is a fast response capacitor which sets the carrier detect time. Capacitor 63 is a noise filter capacitor. Capacitor 64 is a filter capacitor for the filter/comparator input (FLTC). Resistors 65, 66 and capacitor 67 are used to provide an internal analog ground reference which is one half of the 5 v supply. Capacitor 58 provides DC blocking into the transformer 59. Resistor 69 is a feedback resistor to cancel the transmit signal out of the receive signal.

Referring to FIG. 13, the unit has a power on/off circuit which senses when the POWER or on/off button 19 is being actuated, to turn the power "on" or "off" to the unit. This circuit basically comprises quadruple 2-input Schmitt-trigger Nand gates 70, a dual J-K flip-flop 71, a FET 72, a TMOS Switch and chopper 73, and a low current, low dropout voltage regulator 74. Integrated circuits 70 and 71 are CMOS devices which are connected to +18 v at all times, but which draw very small amounts of supply current. Power for Nand gate 70 and flip-flop circuit 71 is from line VB2. The POWER switch 19 is connected to ground on one side, and to a pull-up resistor 75 on the other side. Normally, the junction of power switch 19 and resistor 75 is at +18 v. When the POWER button 19 is pushed, it shorts out this junction or node to ground (i.e., 0 v). Resistor 76 and capacitor 77 provide filtering which eliminates any potential spikes due to contact bounce. Switch activation is sensed on pins 1 and 2 of the gate 70, which inverts the signal to a positive-going voltage when the POWER button 19 is pushed. The other section of gate 70, along with resistors 78 and 79, provide substantial hysteresis at pins 1 and 2 of gate 70, to make the circuit less sensitive to switch bounce. The positive-going signal from gate 70 pin 3 clocks flip-flop circuit 71 so that each time the POWER button 19 is pushed, flip-flop 71 changes state, thus enabling the unit 10 to be powered up and down via a single switch. Capacitor 80 and resistors 81, 82 and 83 provide a reset pulse to the flip-flop 71 whenever batteries are installed to insure that the unit will remain "off" when new batteries are installed. The outputs of the flip-flop circuit 71 are connected to FET's 72 and 73. Resistor 76 connects the transistor /Q output to the gate of FET 72. This FET 72 connects the 18 v battery supply to the +10 v regulator. Resistor 85 connects the transistor Q output to the gate of FET 73, which connects the +9 v battery supply to a +5 v regulator 74.

Figure 6:
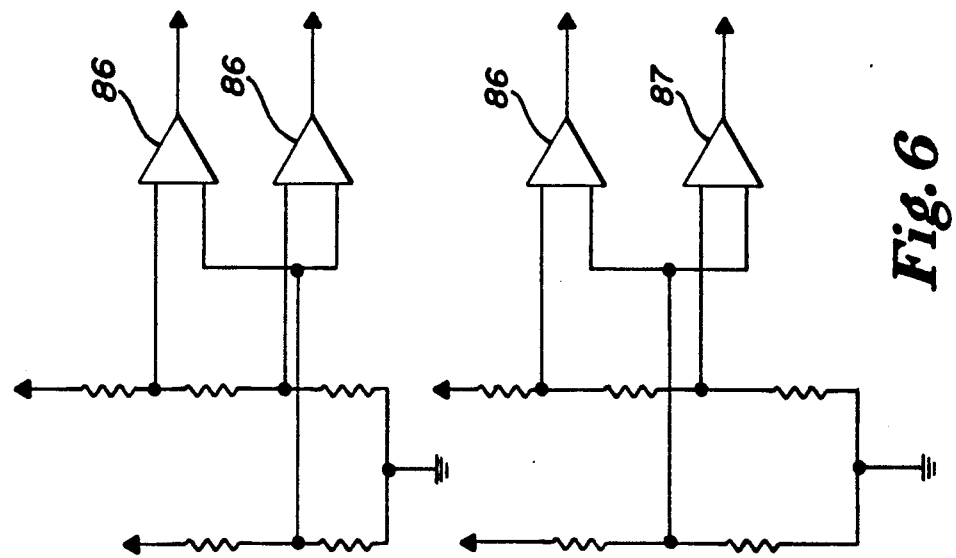
FIG. 6 is a schematic circuit diagram of the low battery detection section of the device.

FIG. 6 shows a low battery sensing circuit which detects low voltage for the 5 volt logic circuit 14 and the 10 volt test circuitry. A low battery condition is indicated on the display 24. Three parts of op-amp 86 and one part of op-amp 87 are used to check the batteries shown in FIG. 11B. VB2 is the voltage off of two 9 volt batteries connected in series, while VB1 is the voltage off of a single third 9 volt battery. Two levels of indication are provided by each battery sensor. The first is a warning that the battery is getting low, indicator lines LO5 and LO10, but that there is enough power left for a few hours of testing remaining. The second level, indicator lines LOLO5 and LOLO10 indicate that the power is so low that the unit can no longer test accurately. Warning and shut down on the 10 volt circuit are 15 and 13 volts, respectively. Warning and shut down on the 5 volt circuit are 7 and 6 volts. These four indicator lines go through multiplexer 157 (see FIG. 9), which is addressed by the microcontroller 25 to select one of the 4 inputs, which then sends the data bit back into the microcontroller 25 on dataline DR to indicate whether a low battery condition exists.

Figure 8:
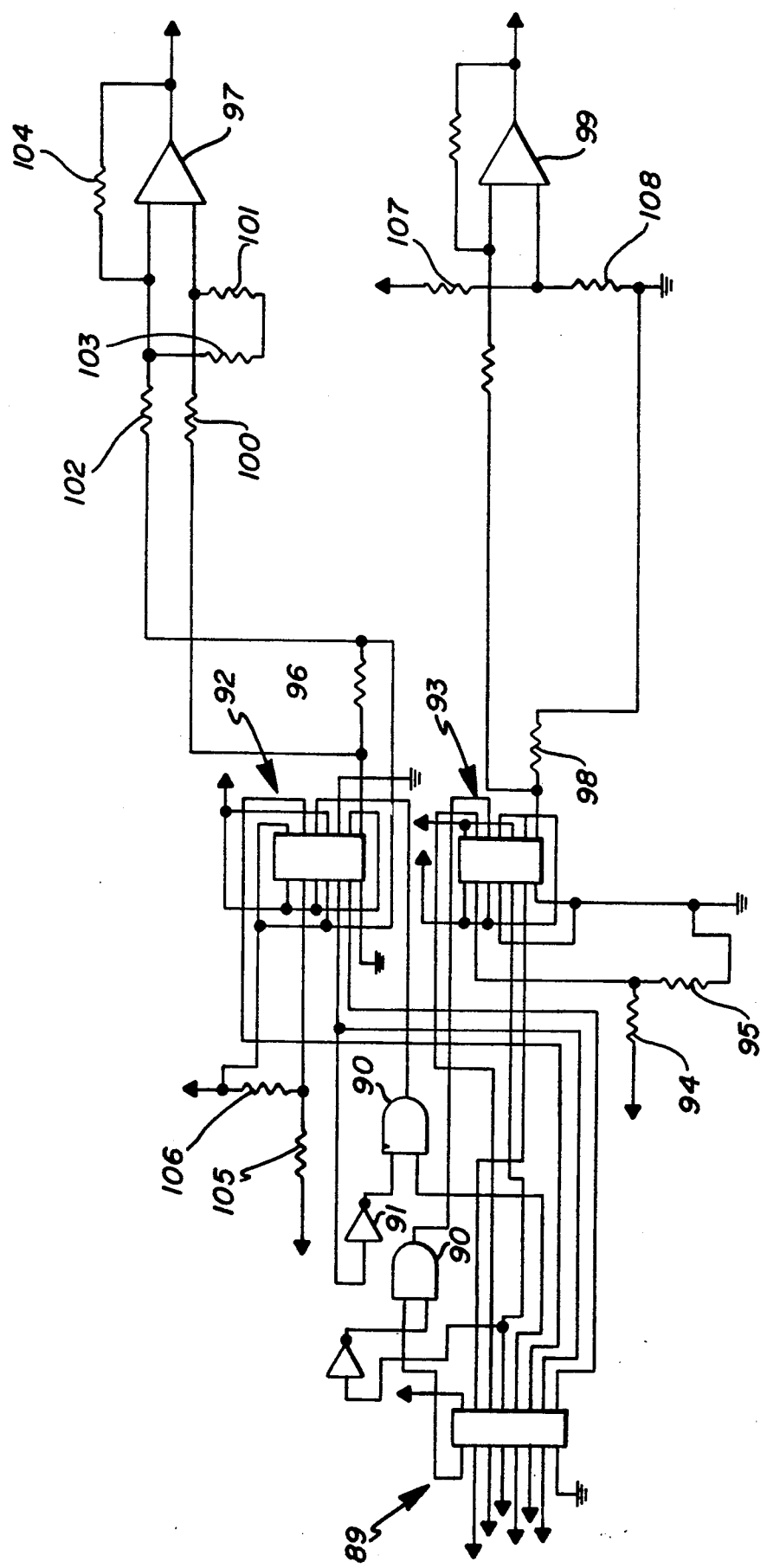
FIG. 8 is a schematic circuit diagram of the test voltage connection and current sensing section of the device.

FIG. 8 shows control and sensing circuitry which performs two functions. The left side of the circuit is a test voltage connection circuit which connects test voltages to the 50 conductors of the cable utilizing the first and second switch banks, via signal lines AN1 and AN2 (see FIGS. 15A and B). The circuit basically comprises an 8-bit addressable latch 89, logic gates 90 and 91, and a pair of quad bilateral switches 92 and 93. The right side of the circuit is a current sensing circuit which cooperates with the first and second switch banks. Switch 92 allows AN1 to connect to +Vcc (+10 v), circuit-ground, the High-tone signal (at the junction of resistors 105 and 106), and a first sensing circuit comprising resistor 96 and one section of op-amp 97. Switch 93 allows AN2 to connect to +Vcc, circuit-ground, the Low-tone signal (at the junction of resistors 94 and 95), and a second sensing circuit comprising resistor 98 and one section of op-amp 99.

Addressing for these functions is as follows (writing a 1 to these addresses activates the function; writing a 0 turns off the function):

| Address | Function |
| --- | --- |
| C0H | Connect AN1 to 50k sense circuit |
| C1H | Connect AN1 to +Vcc |
| C2H | Connect AN1 to High tone |
| C3H | Connect AN1 to circuit-ground |
| C4H | Connect AN2 to circuit-ground |
| C5H | Connect AN2 to Low tone |
| C6H | Connect AN2 to 2k sense circuit |
| C7H | Connect AN2 to +Vcc |

The two sections of logic gates 90 and 91 which connect to latch 89 prevent the software from connecting both +Vcc and circuit-ground to AN1 or AN2 at the same time. This prevents shorting out the power supply through switches 92 or 93, which could damage the chips and drain the batteries.

The first sense circuit (AN1) is used to detect high-resistance current paths (up to above 50 k ohms). The detection sequence is as follows. One side of resistor 96 is connected to +Vcc. When this sense circuit is selected, the other side of resistor 96 is connected to AN1 through switch 92. If signal line AN1 is connected to a cable conductor which has a current path to circuit-ground, it will draw current through resistor 96, and drop the voltage on the AN1 side of resistor 96 below +Vcc. This voltage is connected to the negative (−) input of a section of op amp 97 through resistor divider network 100 and 101, which divides the voltage roughly in half. This puts the sensing voltage in a rang which is allowed by the inputs of the op-amp 97. This sensing voltage is compared to the reference voltage of approximately 2.5 v from resistor divider network 102 and 103, which is applied to the positive (+) input of op-amp 97. Resistor 104 is used to give op-amp 97 hysteresis, which will prevent its output from being in an in-between state or oscillating. Thus, when switch 92 selects this sense circuit, and bank 1 is connected to a cable conductor which has 50 k ohms or less to circuit ground, the output of op-amp 97 will detect the current flow by switching to +10 V at DIN0. If signal line AN1 has a resistance to circuit ground of higher than 50 k ohms, DIN0 will be 0 v.

The second sense circuit (AN2) senses current through resistor 98. When the second sense circuit is selected, resistor 98 is connected to signal line AN2 through switch 93. If a cable conductor connected to signal line AN2 has a current path to +Vcc, it will cause current to flow from ground through resistor 98.

This creates a voltage across resistor 98 which is measured by one section of op-amp 99. Op-amp 99 uses resistors 107 and 108 to create a reference voltage of about 0.5 V on the negative (−) input of op-amp 99. When the voltage across resistor 98 exceeds the reference voltage, it causes the output DIN1 of op-amp 99 to go high (+Vcc). DIN1 will go high whenever the AN2 cable conductor resistance to +Vcc is less than about 3k ohms. This allows for detection of a cable loop of about 2k ohms or less.

FIG. 9 shows a voltage sensing circuit which receives input voltages from the cable wire pairs, via the third switch bank, and from the low battery sensor, and sends information to the microprocessor 25. Signal line AN3 (See FIG. 15C) comes to resistor 109 which functions as a window detector. If a voltage is driven out on the line by the unit that is too far positive or negative it will yield a power fault indication logic level on pin 14 of op-amp 147 which is selected back to the microcontroller 25 through an 8-channel multiplexer 157 on data line DR. The function of this circuit is discussed further below.

Figure 10A:
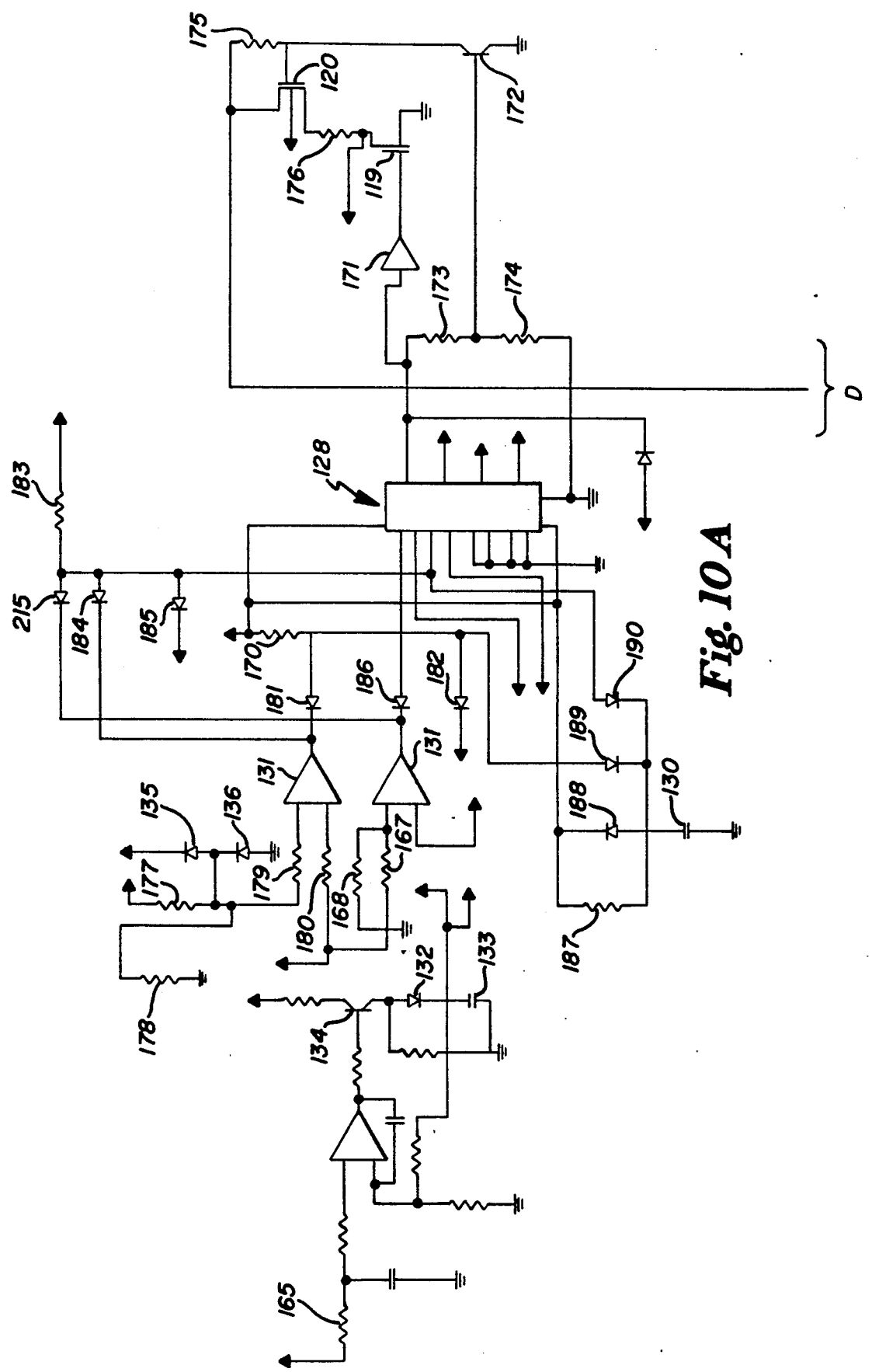
FIG. 10A, 10B are a schematic circuit diagram of the power fault protection controller section of the device.
Figure 10B:
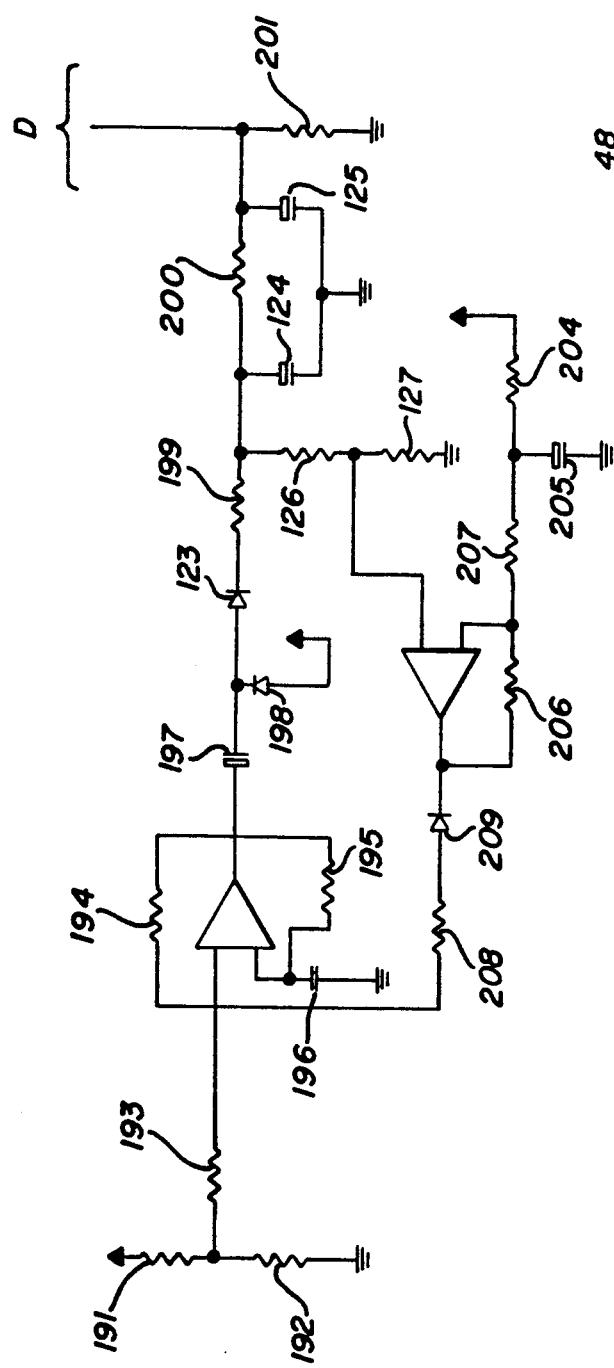

FIG. 10 shows a power fault protection controller circuit which determines whether a voltage is placed on the gate of a protection FET 119 or 120. The lower portion of the circuit functions as a charge pump which produces a 19 volt supply. Op-amp 121 pins 1, 2 and 3 provide an oscillator which pumps charge through capacitor 197 and diode 123 until the voltage on capacitors 124 and 125 is just above 19 volts. When this point is reached, Op-amp 121 pins 5, 6, 7 go to a low state which shuts off the oscillator and stops the charge pump. With the charge pump stopped, the voltage on capacitors 124 and 125 will slowly drain down below 19 volts. This drain down is sensed through resistors 126 and 127 and causes pin 7 of op-amp 121 to go high, which starts the oscillator. The charge pump will again bring the voltage on capacitors 124 and 125 back above the 19 volt level. Op-amp 121 pins 1, 2 and 3 turn "on" and "off" to hold the voltage on capacitor 124 at about 19 volts. The FET's 119 and 120 are used to switch the 19 v to the gates of the protection FETs 158 on each cable conductor.

The upper portion of the circuit generally functions as a line power regulator for sensing power faults on the line and providing power fault protection. Quad positive nand R/S latch 128 has a flip-flop circuit which determines whether to turn the protection "on" or "off". When protection is "on", the circuit turns "on" FET 119, and FET 120 "off" which connects the PRO line to ground, which in turn deactivates the power FETs 158 on the cable conductors. When protection is "off", the protection FET 119 turns "off" and FET 120 turns "on", which connects the PRO line to 19 volts.

Referring also to FIG. 12, a second flip-flop in R/S latch 128 is used to operate (via GDIS) relay 129 which connects an earth ground terminal (EG). Both flip-flops are tripped by sensing an over voltage (positive or negative), and then are both brought up in the protection "on" state, which indicates that line protection is "on" and that relay 129 is open. The flip-flop 128 that operates the earth ground relay 129 is turned "on" or "off" by the microprocessor 25 via lines CVI and CVII. Line CVI opens the relay 129 and line CVII closes the relay 129. The flip-flop that turns the protection "on" and "off" can be caused to do this 3 different ways.

1) On power up, capacitor 130 keeps the input of pin 4 of the flip-flop 128 low. Thus, protection is provided when the unit is first turned "on". This allows the microcontroller 25 to test the line for faults before it turns the protection "off".

2) When a positive over-voltage coming in on the lines is sensed by op-amp 131, pins 8, 9, and 10 (as fed through the protection circuit and switch banks), it raises the voltage at pin 9 of op amp 131. When this voltage is greater than the reference voltage on pin 10, it will change the output of pin 8 of op-amp 131, which will operate the flip-flop 128 to turn the protection "on".

3) Op-amp 131, pins 5, 6, 7 are used to sense negative over-voltage on the lines to turn the protection "on" by comparing the voltage of circuit ground (which is brought in through the diodes 135 and 136 off of the line conductors) and earth ground. When circuit ground becomes lower (5 volts) than earth ground, pin 7 of op-amp 131 will change and cause the flip-flop 128 to turn "on" the protection. Op-amp 131, pins 1, 2, 3, is the 10 volt regulator for this circuit, which holds the voltage at the junction of capacitor 133 and diode 132 at 10 volts.

The circuit shown in FIG. 12 provides a ground reference for the remaining unit circuitry and further functions as a ground continuity detector between the master and remote units.

Referring to FIGS. 15A and B, the first and second switch banks function to connect the signal transmission and sensing circuitry (see FIG. 8) during testing to the 50 wire pairs. Each switch bank comprises a dual binary ¼ decoder 49 or 50 to which are connected seven 8-bit addressable latches 52. Two quad bilateral switches 137 are connected to each latch 52. Two wire pairs (i.e., four conductors) are input to each switch 137 (except two).

The first bank of switches, shown in FIG. 15A, connects any of the 50 lines or conductors to signal line or node (AN1). The second bank of switches, shown in FIG. 15B, connects any of the lines to signal line AN2. Referring also to FIG. 8, via a signal line AN1, the incoming lines can be connected directly to 10 volts (Vcc), or to 10 volts through a 50kΩ resistor 96. Resistor 96 is used to detect high resistance shorts to ground. 10 volts are connected through resistor 96, and will trip the logic level on op-amp 97, pins 12, 13, 14 when the detected short is at 30KΩ or less. Otherwise, it is connected directly to 10 volts, which allows for a high rate of current to flow through the lines for loop testing over increased length loops. AN1 can also be connected to circuit ground or to the high tone HT.

Via signal line AN2, the incoming lines can be connected to ground either directly or through a 200 Ω resistor 98. This resistor 98 is used to generate a voltage for measuring current during loop testing. Line current above a predetermined minimum trips the logic level on op-amp 99, pins 1, 2, 3, which indicates to the microprocessor 25 that the current is above the minimum set by an industry standard 2000Ω loop. AN2 can also be connected to Vcc or to the low tone LT.

On switch bank 1, decoder 49 provides 7 chip select lines, which are the result of decoding address lines A3 through A7. These chip select lines go to seven (7) latches 52. The latches 52 decode the bottom 3 address bits to allow writing to one of 8 different 1-bit latches in each latch 52 chip. The 8 latch outputs of each latch 52 goes to the gate input of a bilateral analog switch in switches 137. Each switch integrated circuit or chip 137 has 4 switches.

One side of each of the fifty switches 137 is connected to nodes AN1 and AN2. The addressees are decoded such that writing a 1 to address OOH will turn the switch 137 that connects Tip 1 line to AN1 while writing a 0 to address OOH will disconnect Tip 1 line from AN1. The address for Ring 1 line is 01H. Addresses for the remaining Tip and Ring conductors of each line are similarly designated.

Referring to FIG. 15C, the third bank of switches enables the unit to select a conductor pair and to read the voltage on the line to determine if there is a power fault on that line prior to testing. The third switch bank utilizes a dual binary ¼ decoder 51, seven 8-bit addressable latches 52, and thirteen quad bilateral switches 137. Since bank 3 is used to measure high voltage faults on the cable, 1 megaohm resistors 139 are connected to the cable conductors to provide protection for the switches. Each switch input also has a diode 140 which connects to a reference voltage of about 7 volts, which is generated by resistor 141 and diode 142. When the input voltage exceeds about 7.5 volts, the diode 140 conducts to the 7 volt reference, and limits the input voltage to the switch 137. This keeps the input voltage always below +Vcc (+10 V) so that the switch 137 will always work properly.

Referring also to FIG. 9, when a bank 3 switch 137 is turned on, it connects its associated cable conductor through a resistor 139, through a switch 137, and to AN3, which goes to the junction of resistors 109 and 144. Each resistor 139 forms a resistor divider network with resistor 144, to +5 volts. When nothing is connected to that conductor, the resistor divider network causes the conductor to charge to +5 volts. Thus, if a conductor floats at +5 volts when selected by a bank 3 switch 137, no power fault exists on that conductor. If a conductor has a voltage on it above +5 volts, it will cause the junction of resistors 109 and 144 to go above +5 volts. If it has a voltage on it less than +5 volts, it will cause the voltage at the junction of resistors 109 and 144 to be less than +5 volts.

Resistor divider network 145-146 creates +5.87 volts which is applied to pin 6 of op-amp 147 through filter components 148, 149, and 150. Resistor divider network 151 and 152 creates +4.70 volts which is applied to pin 10 of op-amp 147 through filter components 153, 154 and 155. If the voltage on the selected cable conductor exceeds +13.7 volts, it will trip op-amp 147 output pin 7 to go high, which, in turn, causes pin 14 to go high. Pin 14 can be read by the microcontroller 25 through multiplexer 157 pin 12. When the voltage on the selected cable conductor drops below +2.0 volts, it trips op-amp 147 output pin 8 to go high. This can be read by the microcontroller 25 through multiplexer 156 pin 13.

In summary, if a line connected through bank 3 has more than +13.7 volts on it, it puts a high logic level on pin 12 of multiplexer 157, indicating that the line has a positive-voltage power fault on it. If the line connected through bank 3 has less than 2.0 volts on it, it puts a high logic level on pin 13 of multiplexer 156, indicating that there is a negative power fault on the line. If the line is not connected to a voltage, the circuit will cause the line to float at +5 volts, and both logic levels will be low, indicating no power fault.

Figure 16A:
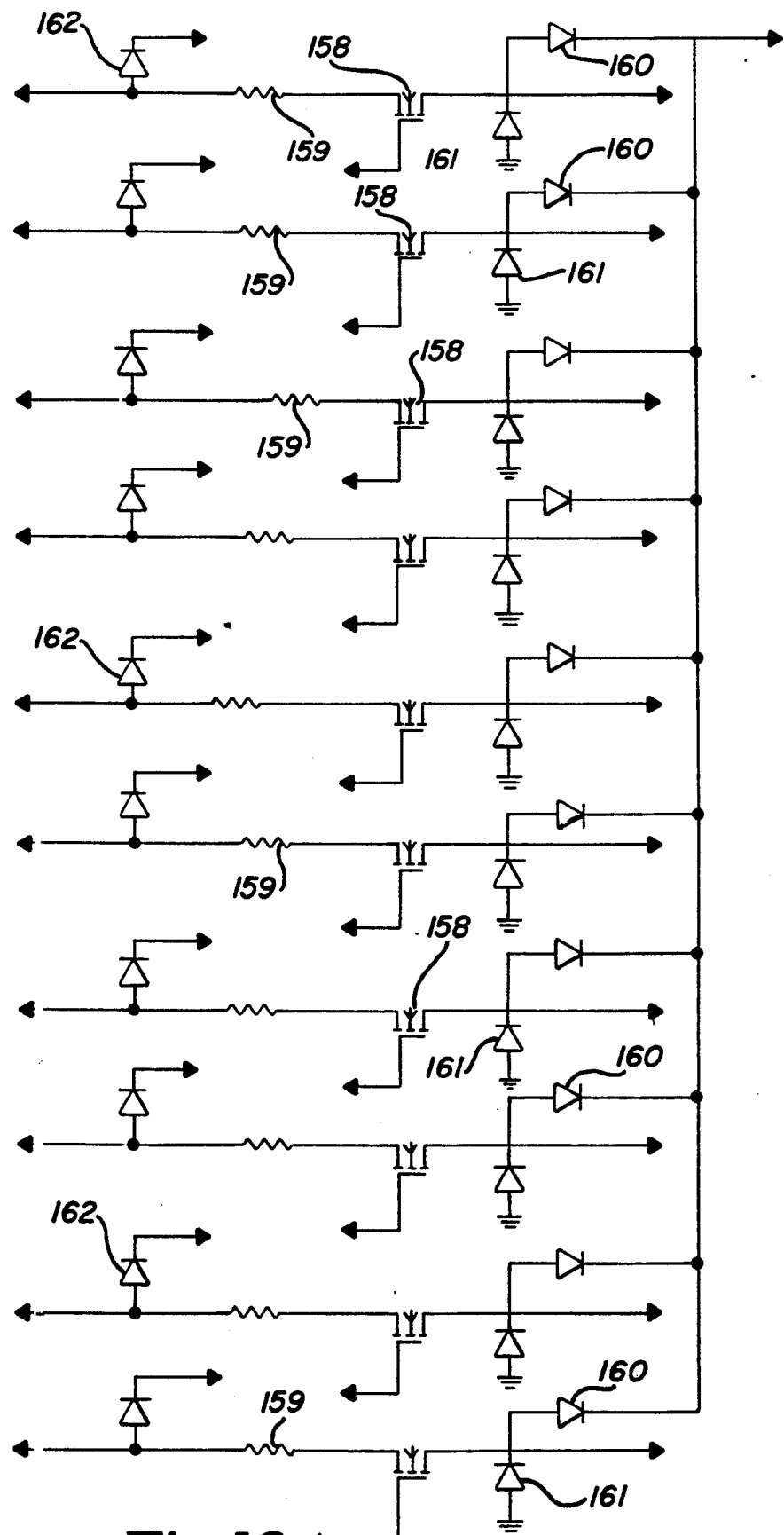
FIG. 16A is a schematic circuit diagram of a portion of the power fault protection section of the device.

Referring to FIG. 16A, input protection to switch banks 1 and (see FIGS. 15A and B) is provided by a power fault protection circuit. FIG. 16A shows exemplary protection circuitry for 10 of the 50 wire-pair paths present in each unit. The connection between each switch in the first and second switch banks, and the cable conductors (Tip X and Ring X) is through the protection circuit which consists of an Npn power FET 158, a 220Ω, 0.5 Watt resistor 159, and 3 diodes 160, 161 and 162. The resistor 159 limits current upon detection of a fault, and further limits the current in a loop test. The power FET 158 disconnects the unit 10 from the line conductors upon detection of high positive or negative voltage or current on the line. The diodes 161 are placed between the power FET 158 and the line, and connected to the ground of the instrument. Each diode 160 conducts any negative voltage on the line to instrument ground. Thus, this ground will always be equal to the lowest voltage found on the line.

The power FETs 158 are N-channel power MOSFETs which have high voltage ratings, low on-resistance and high off-resistance. Each FET 158 can be held on or off with essentially no current flowing into its gate, and thus create no battery drain. Another feature of the FET 158 is that when there is no power at the gate, the FET 158 is "off". Thus, when the power on the tester is "off", the protection is turned "on".

Utilizing conductor pair 1 as an example, TIP1 must pass through FET 158 and resistor 159 to connect with the bank 1 and 2 switches. FET 158 is turned "on" when no protection is needed, and turned "off" when protection is needed. The N-channel MOSFETs 158 can only protect against power-fault voltages of positive polarity. Accordingly, diodes 161 was placed on the line to ground. This assures that if there is a negative-voltage power fault on the conductor, the circuit-ground of the unit will be driven through the input diode 161 to ground, and the circuit-ground will always be the same voltage as the most negative voltage on the conductor. Moreover, the voltage on any conductor will always be equal to circuit-ground, or positive voltage relative to circuit-ground. Thus, if all conductors have only positive voltages relative to circuit-ground, the FETs 158 can provide voltage blocking in all cases. If a positive-voltage power fault were to hit TIP1, the voltage would initially be conducted through FET 158 to resistor 159 and diode 162.

Diode 162 connected between resistor 159 and node TZ limits the voltage coming from the designated conductors or lines to approximately 13 to 14 volts, and it will drop all the voltage across the 220 ohm resistor 159 until the sensor point at MPCB recognizes a power fault and shuts "off" the power FET 158. This occurs in approximately 10 to 100 micro seconds.

Referring to FIG. 16B, diode 163 is a transorb-type zener diode which is connected at point TZ, and which can conduct large currents for short periods of time. The tranzorb 163 provides protection until the protection FETs 158 react to an over voltage, by shorting any voltage over +14 volts to ground (GND). Tranzorb 163 starts conducting around 11.5 volts, so that the voltage at the junction of diode 162 and resistor 159 is limited to about 12 volts. Resistor 159 limits the current during this fault condition.

With the fault voltage and current limited at point AT1, the unit circuitry is protected from damage by the fault. At the same time, With reference also to FIGS. 10 and 15C, the positive fault voltage conducts through diode 160 to circuit node MPCB. MPCB is at nearly Vcc when no fault is present, so that no current will be conducted through diode 160 during normal testing. Resistors 202 and 203 form a voltage divider network which reduces the fault voltage into a workable range for comparator 131. Diode 166 assures that the divided voltage never exceeds about 7 V. Resistors 167 and 168 provide a reference of 3.33 V for this comparator 131. About 15.5 V of positive fault voltage must appear at the junction of resistor 203 and diode 169 to create 3.33 V at pin 9 to trip the comparator. When the comparator 131 is tripped, its output on pin 8 goes low, and pin 4 of S-R flip-flop 128, which is normally held high by pull-up resistor 170, is pulled low. This resets the flip-flop 128. Flip-flop 128 pin 13 (Q1) goes low. This is inverted by circuit 171 and applied to p-channel MOSFET 119, causing FET 119 to turn on and pull node PRO to 0 v. At the same time, FET 120 is turned off, disconnecting the 19 V supply from node PRO while it is shorted to ground by FET 119. FET 120 is turned off by NPN transistor 172 as follows. When flip-flop 128 pin 13 goes to 0 v, the voltage applied to the base of NPN transistor 172 through resistor divider network 173 and 174 goes to 0 v, and transistor 172 turns off, allowing resistor 175 to pull up the gate of FET 120. This turns off FET 120. Resistor 176 limits the current if FETS 119 and 120 are momentarily on at the same time.

The voltage at node PRO is applied to the gates of the power-fault protection FET s 158 (FIG. 16A). When it goes to 0 v, the FET's 158 are shut off. The time between application of positive power fault until the FET's 158 are shut off is less than a millisecond. Thus, diode 169 and resistor 159 only need to provide voltage and current limiting for a short time. After that, FET's 158 are turned off, and disconnect the lines from the unit.

Still referring to FIG. 10, a power fault would also be implied if the EARTH GROUND lead "EG" has a large positive voltage indicating that there is a negative power fault on at least one line. Therefore, the unit also tests for high positive voltage on the EG lead, and activates the protection circuit if it is found. The EG lead is sensed by comparator 131 pin 6. The sensed voltage on the EG lead is divided by resistors 177 and 178. Diodes 135 and 136 assure that the divided voltage will always be between Vcc and circuit-ground. The divided voltage is applied to comparator 131 pin 6 through resistor 179. A reference of 5 V is applied to pin 5 through resistor 180. Resistors 179 and 180 limit the input current to the comparator 131 for protection. When the voltage on EG exceeds 11.0 V, the comparator 131 trips, and the output voltage at pin 7 goes to 0 V, pulling flip-flop 128 pin 4 low through diodes 181 or 186. This resets the flip-flop if it wasn't already reset, and turns "on" the protection by turning "off" the protection FET's 158.

Referring also to FIG. 7, protection can also be turned on by the microcontroller 25. Port pin P2.2 drives PRON line through op-amp 41 pin 7. When the microcontroller 25 pulls PRON line low, it resets the flip-flop 128 through diode 182. Once the protection circuit is turned on, it can only be shut off by the microcontroller 25 by pulling PROF line low and setting the flip-flop 128. Protection can only be turned off if the power faults have been cleared first.

Another flip-flop in curcuit 128 is used to activate the solid-state relay 129 (FIG. 12) which connects the EG lead to the circuit. This flip-flop 128 automatically disconnects the EG lead if a power fault is sensed, similar to the protection circuit. The flip-flop reset line, pin 6 of 128, is normally pulled high by pull-up resistor 183. If a power fault is detected on one of the 50 lines, this pin is pulled low through diodes 184 or 215. The microcontroller 25 can also pull this line low using line CVI through diode 185. The EG lead can only be reconnected by the microcontroller 25, using line CVII to set the flip-flop through pin 7 of 128. The EG lead can only be connected when there are no power faults present.

Capacitor 130, resistor 187, and diodes 188-190 are used to apply a short logic-low pulse to the reset lines of both flip-flops 128 during unit power up. This assures that the unit will start with the protection turned on, and with the EG lead disconnected.

The +19 V used to turn on the power FET's 158 is generated by the charge pump, using 2 sections of op-amp 121. One section of op-amp 121, along with resistors 191-195, and capacitor 196, forms an oscillator. When the oscillator is running, pin 3 of op-amp 121 has a square wave of about 7 V p-p, centered around 9 V. Pin 2 has a sawtooth wave of about 7 V p-p, centered around 9 V. This makes an output on pin 1 of op-amp 121 of a square wave of about 15 V p-p. This is applied to capacitor 197, diode 198, and diode 123 to generate a voltage above the supply voltage, which is nominally 18 V, and is typically 15 V to 16 V. The charge from the charge pump is used to slowly charge capacitor 124 through resistor 199. Resistor 200 and capacitor 125 provide further filtering of the generated 19 V supply, and resistor 201 acts as a bleed-down resistor. The other section of op-amp 121 is used to regulate the output voltage of the charge pump. Pin 6 monitors the voltage on capacitor 124 through voltage dividers 126 and 127. A 5 V reference is filtered by resistor 204 and capacitor 205, and applied to pin 5 of op-amp 121. Resistors 206 and 207 are used to provide an overall hysteresis of about +/−1 v. When the regulator sees the voltage on capacitor 124 go above 20 V, pin 7 of op-amp 121 goes low, and pulls pin 3 low through resistor 208 and diode 209. This shuts off the oscillator, and the voltage on capacitor 124 drops slowly. When the regulator sees the voltage on capacitor 124 go below 18 V, pin 7 of op-amp 121 goes high, and the charge-pump oscillator starts again, slowing charging up capacitor 124.

FIG. 17 shows a connection schematic comprising a ground jack 210, a 25 pair amphenol connector 211, a 4 pair connector 212 for AT&T standard pin count-RJ45, a four pair connector 213 for RJ36 pin count, and a 3 pair jack (RJ14) 214 for 1, 2, and 3 pair testing.

METHOD OF OPERATION

The unit performs a self test upon activation of the POWER switch and prior to cable hookup. The entire display is illuminated for approximately one second, and when the self test is completed, a "TEST O.K." lamp lights momentarily indicating that the unit is ready to proceed. The system also automatically determines whether a remote unit is operatively connected at another location on the cable.

In general, the test system performs 2 functions. First, the system is used to identify cable via a TONE mode, which involves providing a high-low warble tone signal to a particular wire pair by "stepping through" with the ADVANCE or SCAN button. The warble type tone provides an additional troubleshooting aid in that high/low warble is detected only on a properly terminated wire pair, while split wire-pairs detect either a high or low pulsing tone. The red and green segments around each designated pair number 1-25 will light indicating the wire pair upon which tone is transmitted or applied.

Secondly, the system tests for a plurality of cable fault conditions via a TEST mode. When the Remote unit is connected at the distant end of a wire pair and set to the TEST mode, it establishes a communication link between the two units and resets the Master unit to Remote. It also resets the Remote unit to the test function. A test sequence then automatically progresses, and all trouble conditions identified are automatically displayed on both units. The trouble conditions may be viewed individually by using the ADVANCE button to "step through" them one at a time. The total test sequence on a 25 pair cable is conducted in approximately 6 seconds. The system test parameters are coordinated with Bell System standards used throughout the United States.

The first test in the test sequence is a POWER FAULT test. The microprocessor sequentially scans all 25 pairs of conductors in a cable for A.C. or D.C. power. If a voltage of 15 volts or more is detected, the conductors with voltage are identified on the display at both ends and the test sequence stops until all power faults are cleared. The test system continues to monitor for power faults during testing. Internal AC and DC isolation in each unit prevents power from being conducted to other wires and also prevents system damage.

The second test performed is a GROUND FAULT test sequence. This test requires an external ground connection to the test set on both ends. A first subtest is for Ground Continuity which verifies that both grounds are the same potential, and that they are common to each other. Different voltage levels often exist between building grounds causing noisy conditions which affect transmission quality. The second subtest is for Grounded Conductors which could cause noise or complete failure of cable. A ground fault is indicated by a resistance of 75,000Ω or less between ground and the conductor being tested.

The third test is a CONTINUITY sequence which verifies that all pairs have full continuity to the opposite end and back. The following faults are identified if found: SHORT (between distinct wires as indicated by a resistance of 60KΩ or OPEN (lack of continuity as indicated by more than 2.6KΩ between units, depending upon wire guage and length); REVERSAL (proper termination end to end or polarity); and CROSS or TRANSPOSITION (proper termination, end-to-end, with respect to each wire pair and with respect to all other conductors). If all tests are performed satisfactorily and no trouble indications found, the TEST O.K. indicator will illuminate on the display.

Multiple problems of different types are simultaneously displayed utilizing five distinctive lamp flash rates. The first trouble type encountered is identified by a steady lamp indicator. The next problem found in the test sequence flashes at 30 Indications Per Minute (I.P.M. Problem 3 indication is a 60 I.P.M. lamp flash; Problem 4 indication is a 90 I.P.M. lamp flash; and Problem 5 indication is a 120 I.P.M. lamp flash. All troubles may be viewed individually by using the ADVANCE button to block out the other troubles and step through the troubles found one at a time. The above flash rates have been shown to be distinguishable to the human eye and therefore easily identified by technicians.

As many changes are possible to the embodiments of this invention utilizing the teachings thereof, the descriptions above, and the accompanying drawings should be interpreted in the illustrative and not the limited sense.

That which is claimed is:

1. A portable diagnostic system for testing the physical status of a plurality of conductors, comprising:
   a) connection means adapted to be connected to the conductors;
   b) switch means connected to said connection means, said switch means being activatable to provide distinguishable conductive pathways with predetermined conductors, said switch means comprising first and second switch banks, said first and second switch banks each including a plurality of switches being connectible to predetermined conductors, a plurality of addressable latches being connectible to predetermined said switches and a decoder connected to said latches;
   c) signal transmission and reception means connected to said switch means, said transmission and reception means outputting and sensing signals to and from predetermined conductors via said switch means, said signal transmission and reception means comprising, a test voltage connection section, a sensing section, a power supply, and voltage sensing means;
   d) a processing circuit connected with said transmission and reception means, said processing circuit controlling the transmission and reception of said signals to and from the predetermined conductors; and
   e) indicating means connected to said processing circuit and said switch means, said indicating means providing information to distinguish a plurality of status conditions with respect to the conductors, based on the reception of said signal at predetermined conductors.

2. The diagnostic system of claim 1, wherein said connection means comprises a 25-pair, modular cable connector, 3. The diagnostic system of claim 1, wherein said test voltage connection section is connected to said switch means and to said processing circuit, said test voltage connection section comprising a logic circuit and an addressable latch connected to a pair of quad bilateral switches.

4. The diagnostic system of claim 1, wherein said sensing section is connected to said switch means and to said processing circuit, said sensing section comprising at least one sense circuit including a resistance network and an amplifier.

5. The diagnostic system of claim 1, further comprising a low battery detection circuit connected to said power supply and to said processing circuit.

6. The diagnostic system of claim 1, wherein said switch means further comprises a third switch bank communicatively connected to said voltage sensing means, and being for connection to the conductors to detect power faults, said third switch bank including current limiting means connected in series with each conductor.

7. The diagnostic system of claim 1, further comprising power-fault protection means, said power-fault protection means being disposed between said connection means and said first and second switch banks.

8. The diagnostic system of claim 7, further comprising a connection to earth-ground and power-fault control means, said power-fault control means being connected to said processing circuit and to said connection to earth ground.

9. The diagnostic system of claim 8, wherein said power-fault control means comprises a line sensor, a power-fault protection section, and a charge pump.

10. The diagnostic system of claim 1, wherein said processing circuit cooperates with said signal transmission and reception means to automatically and sequentially test predetermined pairs of conductors for voltage of $\geq 15$ volts, for equivalent potential grounds, for resistance of $\leq 75$ K$\Omega$ between ground and the conductor, for resistance of $\geq 2.6$ K$\Omega$ in the conductor loop, for resistance of $\leq 60$ K$\Omega$ between conductors, and for proper polarity.

11. The diagnostic system of claim 1, wherein said signal transmission and reception means operates at a 10-volt level, and wherein said processing circuit includes a plurality of op-amps which convert 5-volt processing circuit logic levels to 10-volt levels utilized by said signal transmission and reception means.

12. The diagnostic system of claim 1, wherein said indicating means includes a color LCD display and an LCD controller, connected to said processing circuit.

13. The diagnostic system of claim 1, comprising two identical apparatus, each said apparatus comprising elements a–e, each said apparatus further comprising a modem and a ground continuity detection section.

14. The diagnostic system of claim 13, wherein the processing circuit of one said apparatus automatically determines whether said second apparatus is connected at a remote location, to the conductor if not a first predetermined battery of tests is performed, if so, a second predetermined battery of tests is performed.

15. A portable diagnostic system for testing the physical status of a plurality of conductors, comprising:
   a) connection means adapted to be connected to the conductors;
   b) switch means connected to said connection means, said switch means being activatable to provide distinguishable conductive pathways with predetermined conductors;
   c) signal transmission and reception means connected to said switch means, said transmission and reception means outputting and sensing signals to and from predetermined conductors;
   d) a processing circuit connected with said transmission and reception means, said processing circuit controlling the transmission and reception of said signals to and from the predetermined conductors; said processing circuit cooperating with said signal transmission and reception means to automatically and sequentially test predetermined pairs of conductors for voltage of $\geq 15$ volts, for equivalent potential grounds, for resistance of $\leq 75$ K$\Omega$ between ground and the conductor, for resistance of $\geq 2.6$ K$\Omega$ in the conductor loop, for resistance of $\leq 60$ K$\Omega$ between conductors, and for polarity; and
   e) indicating means connected to said processing circuit and said switch means, said indicating means providing information to distinguish a plurality of status conditions with respect to the conductors, based on the reception of said signal at predetermined conductors.

16. A portable diagnostic system for testing the physical status of a plurality of conductors, comprising:
   a) connection means adapted to be connected to the conductors;
   b) switch means connected to said connection means, said switch means being activatable to provide distinguishable conductive pathways with predetermined conductors;
   c) signal transmission and reception means connected to said switch means, said transmission and reception means outputting and sensing signals to and from predetermined conductors, said signal transmission and reception means operating at a 10-volt level;
   d) a processing circuit connected with said transmission and reception means, said processing circuit controlling the transmission and reception of said signals to and from the predetermined conductors, said processing circuit including a plurality of op-amps which convert 5-volt processing circuit logic levels to 10-volt levels utilized by said signal transmission and reception means; and
   e) indicating means connected to said processing circuit and said switch means, said indicating means providing information to distinguish a plurality of status conditions with respect to the conductors, based on the reception of said signal at predetermined conductors.

17. A portable, dual unit diagnostic system for testing the physical status of a plurality of conductors, each unit of the system comprising:
   a) connection means adapted to be connected to the conductors;
   b) switch means connected to said connection means, said switch means being activatable to provide distinguishable conductive pathways with predetermined conductors;
   c) signal transmission and reception means connected to said switch means, said transmission and reception means outputting and sensing signals to and from predetermined conductors;
   d) a processing circuit connected with said transmission and reception means, said processing circuit controlling the transmission and reception of said signals to and from the predetermined conductors;
   indicating means connected to said processing circuit and said switch means, said indicating means providing information to distinguish a plurality of status conditions with respect to the conductors, based on the reception of said signal at predetermined conductors;
   f) a modem connected to said processing circuit; and
   g) a ground continuity detection circuit connected to said processing circuit.

* * * * *